(12) United States Patent
Choi et al.

(10) Patent No.: US 12,029,080 B2
(45) Date of Patent: Jul. 2, 2024

(54) DISPLAY DEVICE

(71) Applicants: Samsung Display Co., Ltd., Yongin-Si (KR); IUCF-HYU (Industry-University Cooperation Foundation Hanyang University), Seoul (KR)

(72) Inventors: Duck Kyun Choi, Hwaseong-si (KR); Myeong Ho Kim, Seoul (KR); Jun Hyung Lim, Seoul (KR)

(73) Assignees: Samsung Display Co., Ltd., Yongin-si (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 0 days.

(21) Appl. No.: 17/467,418

(22) Filed: Sep. 6, 2021

(65) Prior Publication Data
US 2022/0165832 A1     May 26, 2022

(30) Foreign Application Priority Data
Nov. 20, 2020    (KR) ........................ 10-2020-0156175

(51) Int. Cl.
    *H10K 59/126*       (2023.01)
    *G09G 3/3233*       (2016.01)
    (Continued)

(52) U.S. Cl.
    CPC ......... *H10K 59/126* (2023.02); *G09G 3/3233* (2013.01); *H01L 27/0255* (2013.01);
    (Continued)

(58) Field of Classification Search
CPC ............. H01L 27/0255; H01L 27/3276; H01L 27/1225; H01L 27/1251; H01L 29/78675; H01L 29/7869; H01L 27/1214; H01L 27/3225; H01L 27/3248; H01L 27/3244; H01L 27/124; H01L 27/1255;
(Continued)

(56) References Cited

U.S. PATENT DOCUMENTS

| 9,728,123 B2 * | 8/2017 | Kim | ..................... G09G 3/3233 |
| 2012/0001896 A1 * | 1/2012 | Han | ..................... G09G 3/3233 |
| | | | 345/76 |

(Continued)

FOREIGN PATENT DOCUMENTS

| CN | 106326855 A | * | 1/2017 | ....... G02F 1/133514 |
| CN | 109686301 A | * | 4/2019 | ............... G09G 3/32 |

(Continued)

*Primary Examiner* — Ricardo Osorio
(74) *Attorney, Agent, or Firm* — Innovation Counsel LLP

(57) ABSTRACT

A display device includes a light emitting element, a first transistor, a second transistor, and a diode. The first transistor may control a driving current flowing to the light emitting element depending on a voltage applied to a gate electrode of the first transistor. The second transistor is electrically connected between the gate electrode of the first transistor and a first electrode of the first transistor. A first electrode of the diode is electrically connected to a first electrode of the second transistor. A second electrode of the diode is electrically connected to the gate electrode of the first transistor.

18 Claims, 15 Drawing Sheets

(51) Int. Cl.
  *H01L 27/02*     (2006.01)
  *H10K 59/121*    (2023.01)
  *H10K 59/131*    (2023.01)
  *H01L 27/12*     (2006.01)
  *H01L 29/786*    (2006.01)

(52) U.S. Cl.
  CPC ..... *H10K 59/1213* (2023.02); *H10K 59/1216* (2023.02); *H10K 59/131* (2023.02); *G09G 2300/0426* (2013.01); *G09G 2300/0819* (2013.01); *G09G 2300/0842* (2013.01); *G09G 2300/0861* (2013.01); *H01L 27/1225* (2013.01); *H01L 27/124* (2013.01); *H01L 27/1251* (2013.01); *H01L 27/1255* (2013.01); *H01L 29/78675* (2013.01); *H01L 29/7869* (2013.01)

(58) Field of Classification Search
  CPC ... G09G 2300/0426; G09G 2300/0842; G09G 2300/0861; G09G 2320/045; G09G 2320/0247; G09G 2320/0214; G09G 3/3233; G09G 2300/0819; H10K 59/126; H10K 59/1213; H10K 59/1216; H10K 59/131; H10K 59/00; H10K 59/123; H10K 59/12
  See application file for complete search history.

(56) References Cited

U.S. PATENT DOCUMENTS

| | | | | |
|---|---|---|---|---|
| 2014/0118409 | A1* | 5/2014 | Jun | G09G 3/3233 |
| | | | | 345/690 |
| 2015/0318337 | A1* | 11/2015 | Jin | H01L 27/3276 |
| | | | | 257/72 |
| 2018/0286314 | A1* | 10/2018 | Cho | H01L 27/1222 |
| 2019/0088209 | A1* | 3/2019 | Kang | H01L 27/1255 |
| 2019/0228707 | A1* | 7/2019 | Park | G09G 3/3258 |
| 2020/0005708 | A1* | 1/2020 | Hwang | H01L 27/3276 |
| 2020/0175911 | A1* | 6/2020 | Ko | G09G 3/30 |

FOREIGN PATENT DOCUMENTS

| | | | | | |
|---|---|---|---|---|---|
| EP | 3503086 | A1 * | 6/2019 | ......... | G09G 3/3233 |
| KR | 2007-0072207 | A | | 7/2007 | |
| KR | 2017-0060214 | A | | 6/2017 | |
| KR | 2018-0063425 | A | | 6/2018 | |
| KR | 20190031403 | A * | 3/2019 | | |
| KR | 10-2001341 | B1 | | 10/2019 | |
| KR | 2020-0029103 | A | | 3/2020 | |
| KR | 2021-0021218 | A | | 2/2021 | |
| KR | 2021-0024368 | A | | 3/2021 | |
| KR | 2021-0027654 | A | | 3/2021 | |
| KR | 2021-0055832 | A | | 5/2021 | |
| KR | 2021-0056479 | A | | 5/2021 | |
| WO | WO-2007042973 | A1 * | 4/2007 | ......... | G09G 3/2011 |

* cited by examiner

DISPLAY DEVICE

This application claims priority to Korean Patent Application No. 10-2020-0156175 filed on Nov. 20, 2020 in the Korean Intellectual Property Office; the Korean Patent Application is incorporated by reference.

BACKGROUND

1. Field

The technical field relates to a display device.

2. Description of the Related Art

A display device may display images according to input signals. Display devices are included in various electronic devices, such as smartphones, tablet computers, digital cameras, notebook computers, navigators, and televisions. A display device includes one or more display panels for displaying images.

An organic light emitting display panel displays an image using organic light emitting elements that emit light by recombination of electrons and holes. The organic light emitting display device includes transistors that control flows of driving currents to the organic light emitting elements.

SUMMARY

Embodiments may be related to a display device including a pixel capable of minimizing or preventing current leakage while sufficiently compensating for a threshold voltage deviation of a driving transistor under a high-speed driving environment.

An embodiment of a display device includes a light emitting element, a first transistor controlling a driving current flowing to the light emitting element depending on a voltage applied to a gate electrode, a second transistor disposed between the gate electrode of the first transistor and a first electrode of the first transistor, and a diode including a first electrode connected to a first electrode of the second transistor and a second electrode connected to the gate electrode of the first transistor.

An embodiment of a display device includes a light emitting element, a first transistor controlling a driving current flowing to the light emitting element depending on a voltage applied to a gate electrode, a second transistor disposed between the gate electrode of the first transistor and a first electrode of the first transistor, and a third transistor connected to the gate electrode of the first transistor and applied with an initialization voltage, wherein an active layer of the first transistor and an active layer of the second transistor include polycrystalline silicon, and an active layer of the third transistor includes an oxide semiconductor.

An embodiment of a display device includes a substrate, a first semiconductor layer disposed on the substrate and including an active layer of a first transistor, a first gate insulating layer disposed on the first semiconductor layer, a first conductive layer disposed on the first gate insulating layer and including a gate electrode of the first transistor, a second gate insulating layer disposed on the first conductive layer, a first electrode of a diode disposed on the second gate insulating layer, a first interlayer insulating layer disposed on the first electrode of the diode, a second semiconductor layer disposed on the first interlayer insulating layer and including an active layer of a second transistor and a second electrode of the diode, a second interlayer insulating layer disposed on the second semiconductor layer, and a second conductive layer disposed on the second interlayer insulating layer and including first and second electrodes of the first transistor, wherein the first semiconductor layer includes polycrystalline silicon, and the second semiconductor layer includes an oxide semiconductor.

An embodiment may be related to a display device. The display device may include a light emitting element, a first transistor, a second transistor, and a diode. The first transistor may control a driving current flowing to the light emitting element depending on a voltage applied to a gate electrode of the first transistor. The second transistor may be electrically connected between the gate electrode of the first transistor and a first electrode of the first transistor. A first electrode of the diode may be electrically connected to a first electrode of the second transistor. A second electrode of the diode may be connected to the gate electrode of the first transistor.

The first electrode of the diode may include a metal. The second electrode of the diode may include an oxide semiconductor.

In the diode, a current may flow from the first electrode of the diode to the second electrode of the diode.

Each of an active layer of the first transistor and an active layer of the second transistor may include polycrystalline silicon.

The display device may include a third transistor electrically connected to the gate electrode of the first transistor and receiving an initialization voltage. An active layer of the third transistor may include an oxide semiconductor.

The first transistor and the second transistor may be PMOS transistors. The third transistor may be an NMOS transistor.

A material of the second electrode of the diode may be identical to a material of the active layer of the third transistor.

The display device may further include an insulator and a capacitor. A first electrode of the capacitor may be electrically connected to the gate electrode of the first transistor. A second electrode of the capacitor may overlap the first electrode. The first electrode of the diode and the second electrode of the capacitor may be disposed directly on a same surface of the insulator.

The display device may include a fourth transistor electrically connected to a second electrode of the first transistor and receiving a data voltage.

The display device may include a scan line electrically connected through no intervening transistor to both a gate electrode of the second transistor and a gate electrode of the fourth transistor.

An embodiment may be related to a display device. The display device may include the following elements: a light emitting element; a first transistor controlling a driving current flowing to the light emitting element depending on a voltage applied to a gate electrode of the first transistor; a second transistor electrically connected between the gate electrode of the first transistor and a first electrode of the first transistor; and a third transistor electrically connected through no intervening transistor to the gate electrode of the first transistor and receiving an initialization voltage. Each of an active layer of the first transistor and an active layer of the second transistor may include polycrystalline silicon. An active layer of the third transistor may include an oxide semiconductor.

The display device may include a diode electrically connected between the second electrode of the second transistor and the gate electrode of the first transistor.

A first electrode of the diode may include a metal. A second electrode of the diode may include an oxide semiconductor.

A material of the second electrode of the diode may be identical to a material of the active layer of the third transistor.

The display device may include an insulator and a capacitor. A first electrode of the capacitor may be electrically connected to the gate electrode of the first transistor. A second electrode of the capacitor may overlap the first electrode. The first electrode of the diode and the second electrode of the capacitor may be disposed directly on a same surface of the insulator.

The display device may include a fourth transistor electrically connected to a second electrode of the first transistor and receiving a data voltage.

The display device may include a scan line electrically connected through no intervening transistor to both a gate electrode of the second transistor and a gate electrode of the fourth transistor.

A display device may include a substrate, a first transistor, a second transistor, a diode, a first gate insulating layer, a second gate insulating layer, a first interlayer insulating layer, and a second interlayer insulating layer. The first gate insulating layer may be disposed between a gate electrode of the first transistor and an active layer of the first transistor. The active layer of the first transistor may be disposed between the gate electrode of the first transistor and the substrate. The second gate insulating layer may be disposed between a first electrode of the diode and the substrate. The gate electrode of the first transistor may be disposed between the second gate insulating layer and the substrate. The first interlayer insulating layer may be disposed between a second electrode of the diode and the substrate. The first electrode of the diode may be disposed between the first interlayer insulating layer and the substrate. The first interlayer insulating layer may be disposed between an active layer of a second transistor and the substrate. The second interlayer insulating layer may be disposed between a first electrode of the first transistor and the substrate and may be disposed between a second electrode of the first transistor and the substrate. Each of the second electrode of the diode and the active layer of the second transistor may be disposed between the second interlayer insulating layer and the substrate. The active layer of the first transistor may include polycrystalline silicon. Each of the active layer of the second transistor and the second electrode of the diode may include an oxide semiconductor.

The display device may include a connection member electrically connecting the first electrode of the first transistor and the first electrode of the diode.

The connection member may be connected to a first electrode of the second transistor through a first contact hole penetrating the second interlayer insulating layer, the first interlayer insulating layer, the second gate insulating layer, and the first gate insulating layer.

The connection member may be connected to the first electrode of the diode through a second contact hole penetrating the second interlayer insulating layer and the first interlayer insulating layer.

The display device may include a capacitor. A first electrode of the capacitor may be electrically connected to the gate electrode of the first transistor. A second electrode of the capacitor may overlap the first electrode of the capacitor.

The second gate insulating layer may be disposed between the second electrode of the capacitor and the substrate.

A material of the first electrode of the diode may be identical to a material of the second electrode of the capacitor.

According to a display device of an embodiment, even when one pixel is placed under a high-speed driving environment, current leakage may be minimized or prevented, and a threshold voltage deviation of a driving transistor may be sufficiently compensated for.

DETAILED DESCRIPTION OF EMBODIMENTS

Example embodiments are described with reference to the accompanying drawings. Practical embodiments may be embodied in different forms and should not be construed as limited to the example embodiments.

When an element is referred to as being "on" a layer, the element can be directly on the layer, or the element can be indirectly on the layer with one or more intervening items being present between the element and the layer. The same reference numbers may indicate the same components or analogous elements. In the figures, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "compensate" may mean "adjust." The term "portion" may mean "section." The term "extend" may mean "have its lengthwise direction" or "be lengthwise." The term "pattern" may mean "member." The term "plan view" may mean "plan view of a/the display device."

Figure 1:
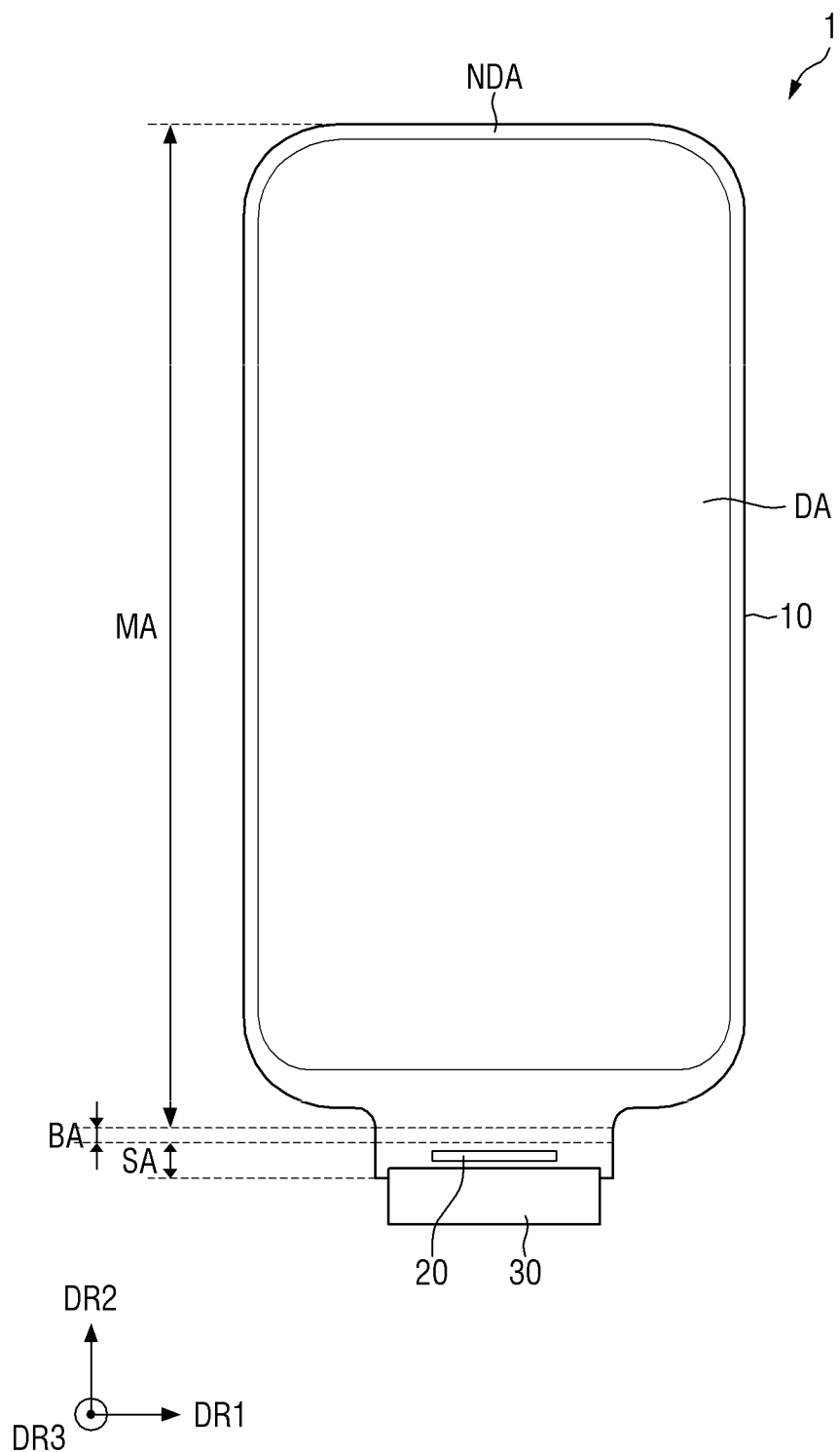
FIG. 1 is a plan view of a display device according to an embodiment.
Figure 2:
FIG. 2 is a side view of the display device of FIG. 1 according to an embodiment.
Figure 2:
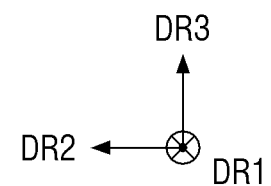

FIG. 1 is a plan view of a display device 1 according to an embodiment. FIG. 2 is a side view of the display device according to an embodiment. FIG. 2 illustrates the display device 1 in a bent state.

The display device 1 may display a moving image or a still image according to input signals. The display device may be used as a display screen of one of various products such as televisions, notebooks, monitors, billboards, internet of things (IOTs) devices, mobile phones, smartphones, tablet personal computers (tablet PCs), smart watches, watch phones, mobile communication terminals, electronic notebooks, electronic books, portable multimedia players (PMPs), navigators, and ultra-mobile PCs (UMPCs).

The display device 1 may have a substantially rectangular shape in a plan view. The display device 1 may have rounded corners in a plan view.

In the drawings, the first direction DR1 indicates a horizontal direction in a plan view of the display device 1, the second direction DR2 indicates a vertical direction in the plan view of the display device 1, and the third direction DR3 indicates a thickness direction of the display device 1. The first direction DR1 and the second direction DR2 may be perpendicular to each other, and the third direction DR3 may be perpendicular to each of the first direction DR1 and the second direction DR2.

Unless otherwise defined, the terms "upper portion," "upper surface," and "upper side" may be based on the third direction DR3 toward a display surface of the display panel 10, and the terms "lower portion," "lower surface," and "lower side" may be based on the third direction DR3 toward a side of the display panel 10 that is opposite the display surface of the display panel 10.

The display device 1 may have short sides and long sides. The short sides of the display device 1 may extend in the first direction DR1. The long sides of the display device 1 may extend in the second direction DR2. The display device 1 may have one or more of a circular shape, an elliptical shape, and another shape in a plan view of the display device 1.

The display device 1 may include a display panel 10. The display panel 10 may include a flexible substrate including a flexible polymer material such as polyimide. Accordingly, the display panel 10 may be warped, bent, folded, or rolled.

The display panel 10 may be/include an organic light emitting display panel. The display panel 10 may be/include one or more of a liquid crystal display (LCD) panel, a quantum dot organic light emitting display (QD-OLED) panel, a quantum dot liquid crystal display (QD-LCD) panel, a quantum nano light emitting display panel, and a micro light emitting diode.

The display panel 10 may include a display area DA in which an image is displayed according to input signals and may include a non-display area NDA no image is displayed according to input signals. The non-display area NDA may be disposed to surround the display area DA. The non-display area NDA may constitute a bezel.

The display area DA may have a rectangular shape with right-angle corners or rounded corners. The display area DA may have short sides and long sides. The short sides of the display area DA may extend in the first direction DR1. The long sides of the display area DA may extend in the second direction DR2. The display area DA may have a circular shape, an elliptical shape, and/or another shape.

The display area DA may include a plurality of pixels. The pixels may be arranged in a matrix. Each pixel may include a light emitting layer and a circuit layer that controls the amount of light emitted from the light emitting layer. The circuit layer may include lines, electrodes, and at least one transistor. The light emitting layer may include an organic light emitting material. The light emitting layer may be sealed by an encapsulation layer.

The non-display area NDA may be disposed adjacent to the short sides and long sides of the display area DA. The non-display area NDA may surround the display area DA. The non-display area NDA may be present at less than four sides of the display area DA.

The display panel 10 may include a main area MA and a bending area BA connected to one side of the main area MA in the second direction DR2. The display panel 10 may further include a sub-area SA connected to one side of the bending area BA in the second direction DR2 and (after the bending area BA has been bent) overlapping the main area MA in the thickness direction DR3.

The display area DA may be located in the main area MA. The non-display area NDA may include portions located at edges of the display area DA in the main area MA and may include portions located in the areas BA and SA.

The main area MA may have a shape similar to the planar appearance of the display device 1. The main area MA may be substantially flat. The main area MA may include one or more curved surface and/or one or more bent structures.

In the main area MA, if at least one of the edges (other than the edge connected to the bending area BA) is bent, the display area DA may extend to the bent area and/or a portion of the non-display area NDA may be disposed at the bent area.

The non-display area NDA of the main area MA may span from the outer boundary of the display area DA to the edge of the display panel 10. In the main area MA, signal lines or driving circuits for applying signals to the display area DA may be arranged in the non-display area NDA.

The bending area BA may be connected to one short side of the main area MA. The width of the bending area BA in the first direction DR1 may be smaller than the width of the main area MA in the first direction DR1. The connection portion between the main area MA and the bending area BA may have an L-shaped cut to reduce the width of a bezel.

The bending area BA may be bent with a curvature. After the display panel 10 has been bent at the bending area BA, the main area MA may overlap the sub-area SA.

The sub-area SA may overlap the main area MA in the thickness direction of the display panel 10. The sub-area SA may overlap a portion of the non-display area NDA and a portion the display area DA that are near an edge of the main area MA. The width of the sub-area SA in the first direction DR1 may be the same as the width of the bending area BA in the first direction DR1.

A conductive pad set (not shown) may be disposed on the sub-area SA of the display panel 10. One or more external devices may be mounted (or attached) onto the pad set (not shown). Examples of the external device(s) may include a driving chip 20 and a driving substrate 30 such as a flexible printed circuit board or a rigid printed circuit board. A line connection film, a connector, and the like may be mounted on the pad set. The driving chip 20 may be substantially disposed on the sub-area SA of the display panel 10, and the driving substrate 30 may partially overlap the sub-area SA and may be attached to the end of the sub-area SA. The display panel 10 may include both a pad subset connected to the driving chip 20 and a pad subset connected to the driving substrate 30. The driving chip 20 may be mounted on a film, and the film may be attached to the sub-area SA of the display panel 10.

The driving chip 20 may be mounted on a surface of the display panel 10 that is coplanar with the display surface of the display panel 10 before the display panel 10 is bent. After the bending area BA is bent, the surface that the driving chip 20 is mounted on may be opposite the display surface of display panel 10.

The driving chip 20 may be attached onto the display panel 10 through an anisotropic conductive film or through ultrasonic bonding. The driving chip 20 may be narrower than the display panel 10 in the first direction DR1. The driving chip 20 may be disposed at the center of the sub-area SA in the first direction DR1, and the left and right edges of the driving chip 20 may be spaced apart from the left and right edges of the sub-area SA, respectively.

The driving chip 20 may include an integrated circuit that drives the display panel 10. The integrated circuit may be a data driving integrated circuit generating and providing data signals. The driving chip 20 may be connected to a line pad (not shown) provided in the pad set of the display panel 10 to provide a data signal to the line pad (not shown). The lines connected to the line pad (not shown) may extend to the display area DA to apply data signals to pixels in the display area DA.

Figure 3:
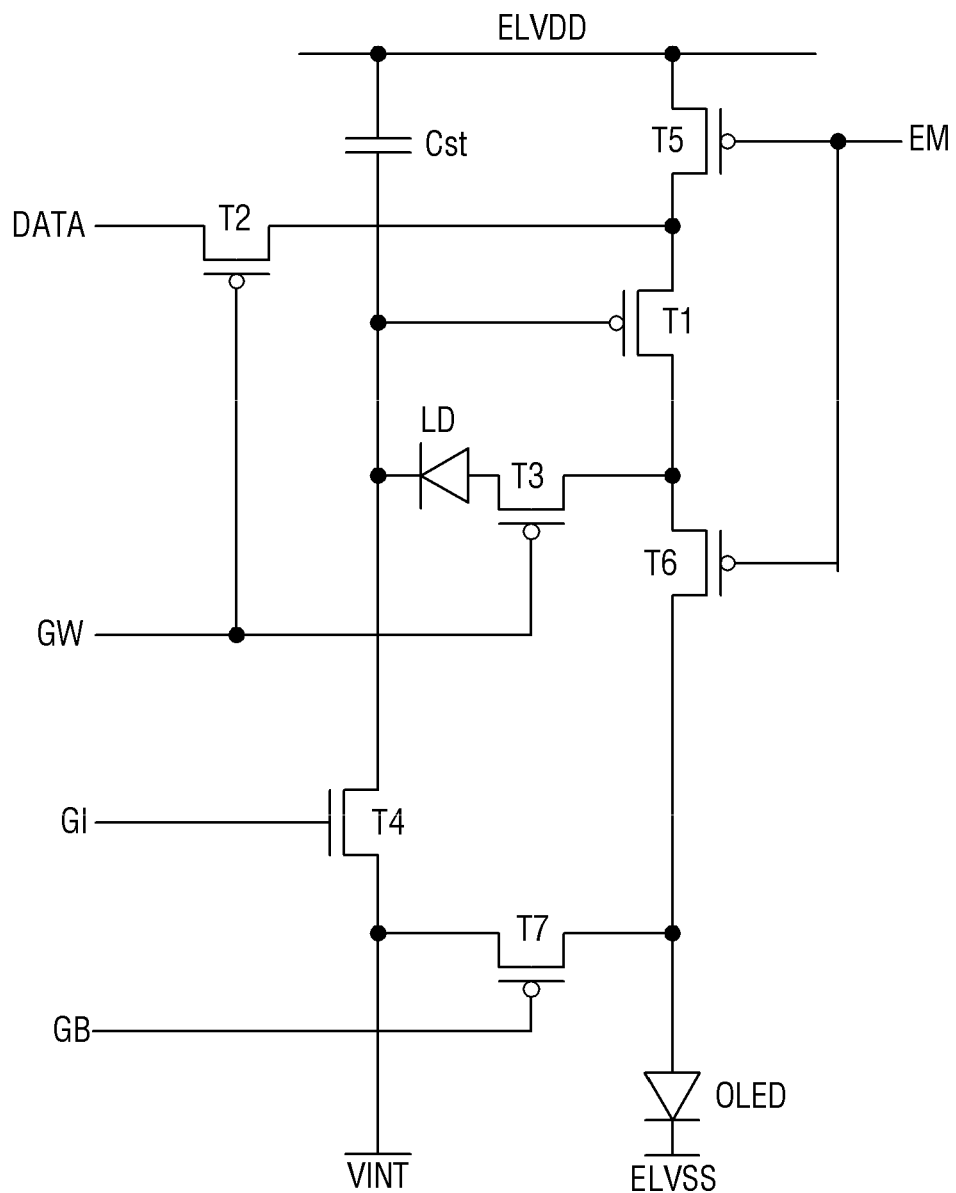
FIG. 3 is an equivalent circuit diagram of one pixel of a display device according to an embodiment.

FIG. 3 is an equivalent circuit diagram of one pixel of a display device according to an embodiment.

Referring to FIG. 3, the circuit of one pixel of an organic light emitting display device includes an organic light emitting diode OLED, a plurality of transistors T1 to T7, a capacitor Cst, and a leakage prevention diode LD. A data signal DATA, a first scan signal GW, a second scan signal GI, a third scan signal GB, a light emission control signal EM, a first power voltage ELVDD, a second power voltage ELVSS, and an initialization voltage VINT are applied to the circuit of one pixel through corresponding conductive lines.

The organic light emitting diode OLED includes an anode electrode (or a first electrode) and a cathode electrode (or a second electrode). The capacitor Cst includes a first electrode and a second electrode. The leakage prevention diode LD includes a first electrode (or an anode electrode) and a second electrode (a cathode electrode).

Each of the transistors T1 to T7 includes a gate electrode, a first source/drain electrode (or first electrode), and a second source/drain electrode (or second electrode). One of the first source/drain electrode and second source/drain electrode is a source electrode, and the other is a drain electrode.

Each of the transistors T1 to T7 may be a thin film transistor. Each of the transistors T1 to T7 may be one of a PMOS transistor and an NMOS transistor. Each of the first transistor T1 (a driving transistor), the second transistor T2 (a data transfer transistor), the third transistor T3 (a compensation transistor), the fifth transistor T5 (a first light emission control transistor), the sixth transistor T6 (a second light emission control transistor), and the seventh transistor T7 (a second initialization transistor) may be a PMOS transistor. The fourth transistor T4 (a first initialization transistor) may be an NMOS transistor.

The gate electrode of the first transistor T1 is connected to each of the first electrode of the capacitor Cst and the second electrode of the leakage prevention diode LD. The first source/drain electrode of the first transistor T1 is connected to a first power voltage ELVDD terminal/line through the fifth transistor T5. The second source/drain electrode of the first transistor T1 is connected to the anode electrode of the organic light emitting diode OLED through the sixth transistor T6. The first transistor T1 receives a data signal DATA according to the switching operation of the second transistor T2 and supplies a driving current to the organic light emitting diode OLED.

The gate electrode of the second transistor T2 is connected to a first scan signal GW terminal/line. The first source/drain electrode of the second transistor T2 is connected to a data signal DATA terminal/line. The second source/drain electrode of the second transistor T2 is connected to the first source/drain electrode of the first transistor T1 and is connected to the first power voltage ELVDD terminal through the fifth transistor T5. The second transistor T2 is turned on according to the first scan signal GW to perform a switching operation of transmitting the data signal DATA to the first source/drain electrode of the first transistor T1.

The gate electrode of the third transistor T3 is connected to the first scan signal GW terminal. The first source/drain electrode of the third transistor T3 is connected to the second source/drain electrode of the first transistor T1 and is connected to the anode electrode of the organic light emitting diode OLED through the sixth transistor T6. The second source/drain electrode of the third transistor T3 is connected to the first electrode of the leakage prevention diode LD. The second source/drain electrode of the third transistor T3 is connected to the first electrode of the capacitor Cst, the first source/drain electrode of the fourth transistor T4, and the gate electrode of the first transistor T1 through the leakage prevention diode LD.

The third transistor T3 is turned on by the first scan signal GW to connect the gate electrode and second source/drain electrode of the first transistor T1 to connect the first transistor T1 as a diode. Accordingly, a voltage difference may occur between the first electrode and gate electrode of the first transistor T1 by the threshold voltage of the first transistor T1, and the threshold voltage-compensated/adjusted data signal DATA may be supplied to the gate electrode of the first transistor T1, thereby compensating for a threshold voltage deviation of the first transistor T1.

Since the third transistor T3 is a PMOS transistor, the third transistor T3 may have higher electron mobility than an NMOS transistor. Accordingly, even under a high-speed driving environment of 120 Hz or higher, the threshold voltage deviation of the first transistor T1 may be easily compensated for.

The gate electrode of the fourth transistor T4 is connected to a second scan signal GI terminal/line. The second source/drain electrode of the fourth transistor T4 is connected to an initialization voltage VINT terminal/line. The first source/drain electrode of the fourth transistor T4 is connected together to the first electrode of the capacitor Cst, the second electrode of the leakage prevention diode LD, and the gate electrode of the first transistor T1. The fourth transistor T4 is turned on according to the second scan signal GI to transmit the initialization voltage VINT to the gate electrode of the first transistor T1 to initialize the voltage of the gate electrode of the first transistor T1.

Since the fourth transistor T4 is an NMOS transistor having relatively excellent turn-off characteristics, the leakage of a driving current during the light emission period of the organic light emitting diode OLED may be minimized or prevented, and the leakage of a current transmitted to the gate electrode of the first transistor T1 may be minimized or prevented.

The gate electrode of the fifth transistor T5 is connected to a light emission control signal EM terminal/line. The first source/drain electrode of the fifth transistor T5 is connected to the first power voltage ELVDD terminal. The second source/drain electrode of the fifth transistor T5 is connected to the first source/drain electrode of the first transistor T1 and the second source/drain electrode of the second transistor T2.

The gate electrode of the sixth transistor T6 is connected to the light emission control signal EM terminal. The first source/drain electrode of the sixth transistor T6 is connected to the second source/drain electrode of the first transistor T1 and the first source/drain electrode of the third transistor T3. The second source/drain electrode of the sixth transistor T6 is connected to the anode electrode of the organic light emitting diode OLED.

The fifth transistor T5 and the sixth transistor T6 are simultaneously turned on according to the light emission control signal EM, and thus, a driving current flows through the organic light emitting diode OLED.

The gate electrode of the seventh transistor T7 is connected to the light emission control signal EM terminal/line. The first source/drain electrode of the seventh transistor T7 is connected to the anode electrode of the organic light emitting diode OLED. The second source/drain electrode of the seventh transistor T7 is connected to the initialization voltage VINT terminal/line. The seventh transistor T7 is turned on according to a third scan signal GB to initialize the anode electrode of the organic light emitting diode OLED.

In some embodiments, the gate electrode of the seventh transistor T7 may receive the light emission control signal EM. In some embodiments, the gate electrode of the seventh transistor T7 may receive the first scan signal of another pixel.

The second electrode of the capacitor Cst is connected to the first power voltage ELVDD terminal/line. The first electrode of the capacitor Cst is connected to each of the gate electrode of the first transistor T1, the second electrode of the leakage prevention diode LD, and the first source/drain electrode of the fourth transistor T4. The cathode electrode of the organic light emitting diode OLED is connected to a second power supply voltage ELVSS terminal/line. The organic light emitting diode OLED receives a driving current from the first transistor T1 and emits light for the display device to display an image.

The first electrode of the leakage prevention diode LD is connected to the second source/drain electrode of the third transistor T3. The second electrode of the leakage prevention diode LD is connected to each of the gate electrode of the first transistor T1, the first electrode of the capacitor Cst, and the first source/drain electrode of the fourth transistor T4. Since the leakage prevention diode LD is connected between the second source/drain electrode of the third transistor T3 and the gate electrode of the first transistor T1, the leakage of a driving current during the light emission period of the organic light emitting diode OLED may be minimized or prevented, and the leakage of a current transmitted to the gate electrode of the first transistor T1 may be minimized or prevented.

Figure 4:
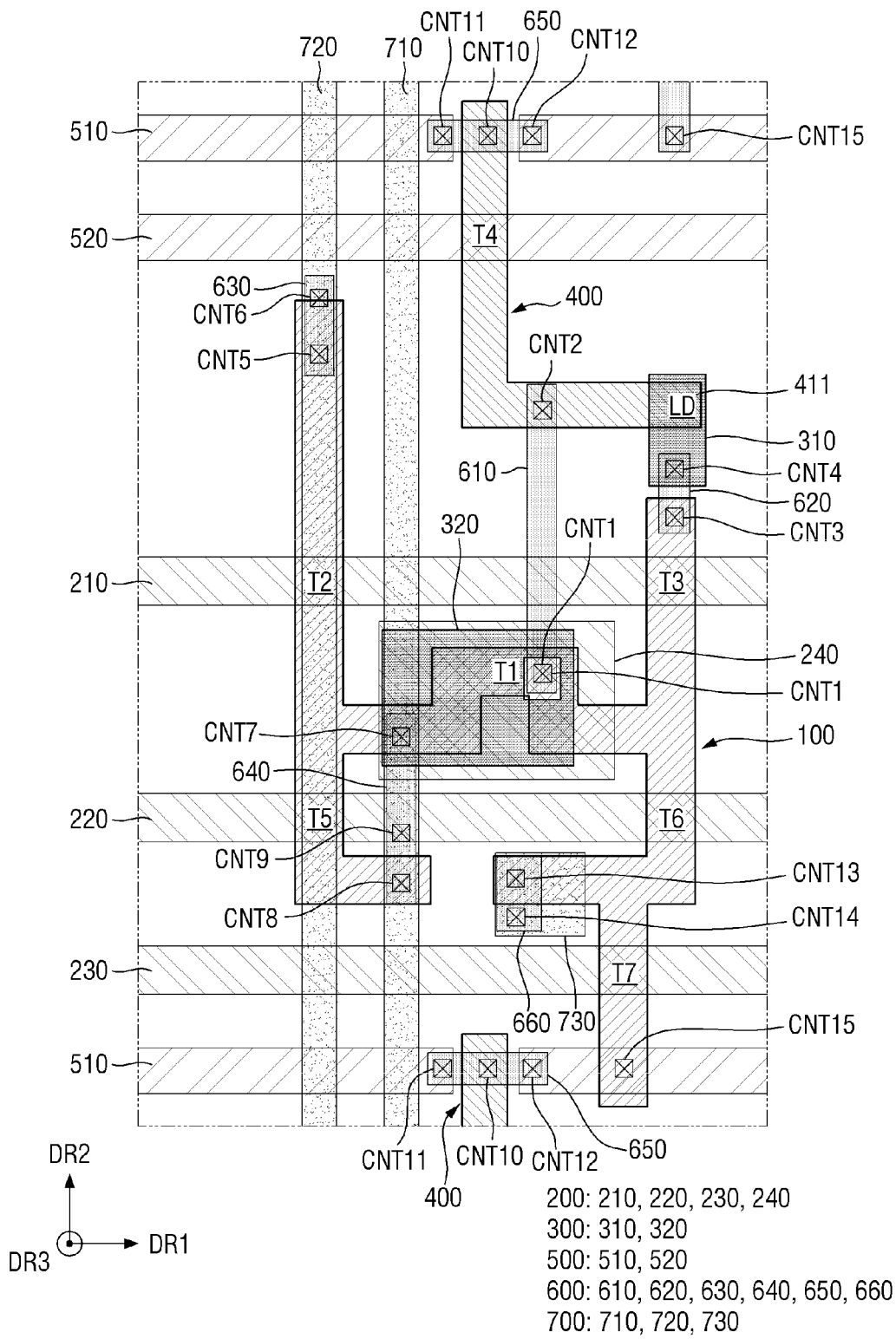
FIG. 4 is a layout view of one pixel of a display device according to an embodiment.
Figure 5:
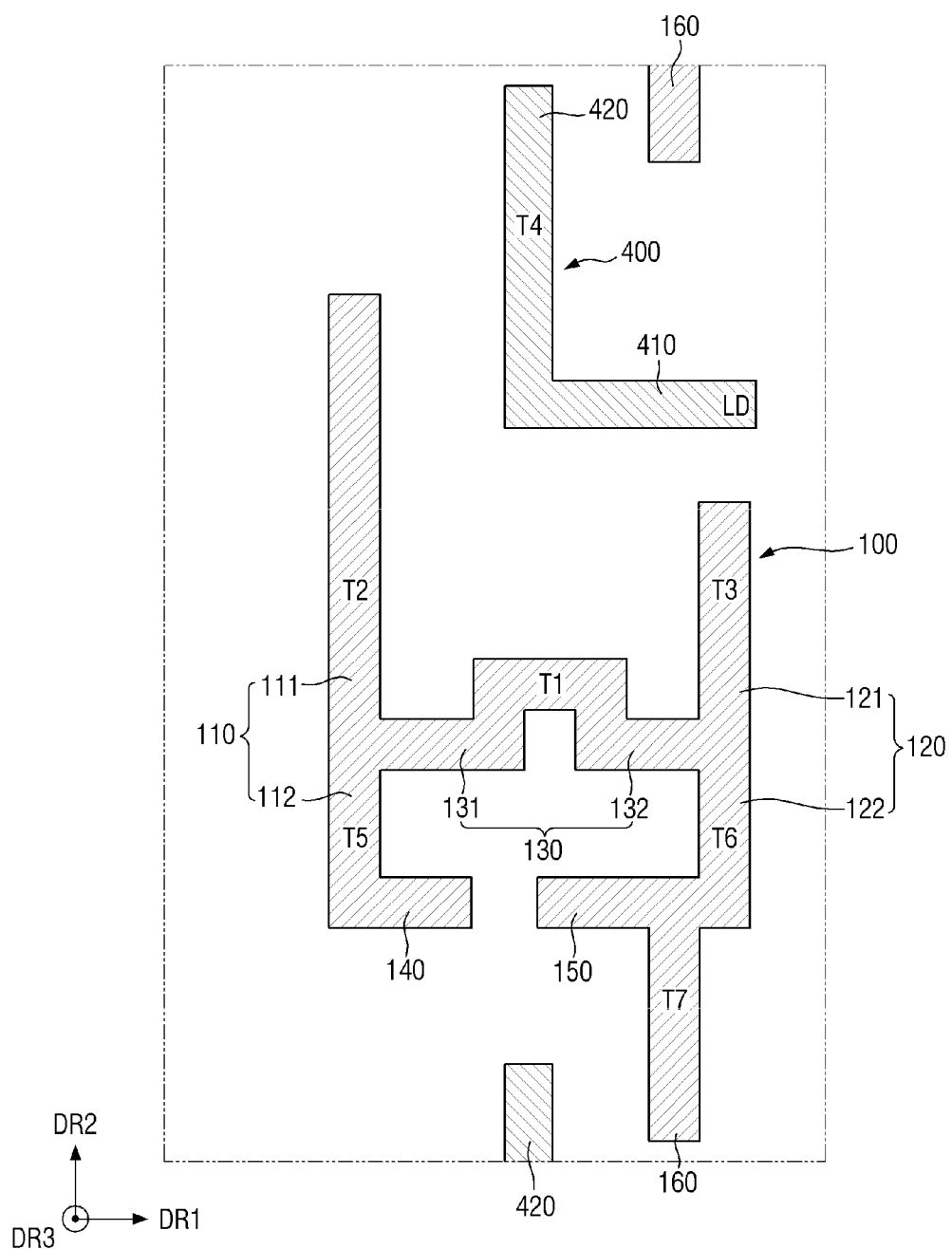
FIG. 5 is a layout view of a first semiconductor layer and a second semiconductor layer in FIG. 4 according to an embodiment.
Figure 6:
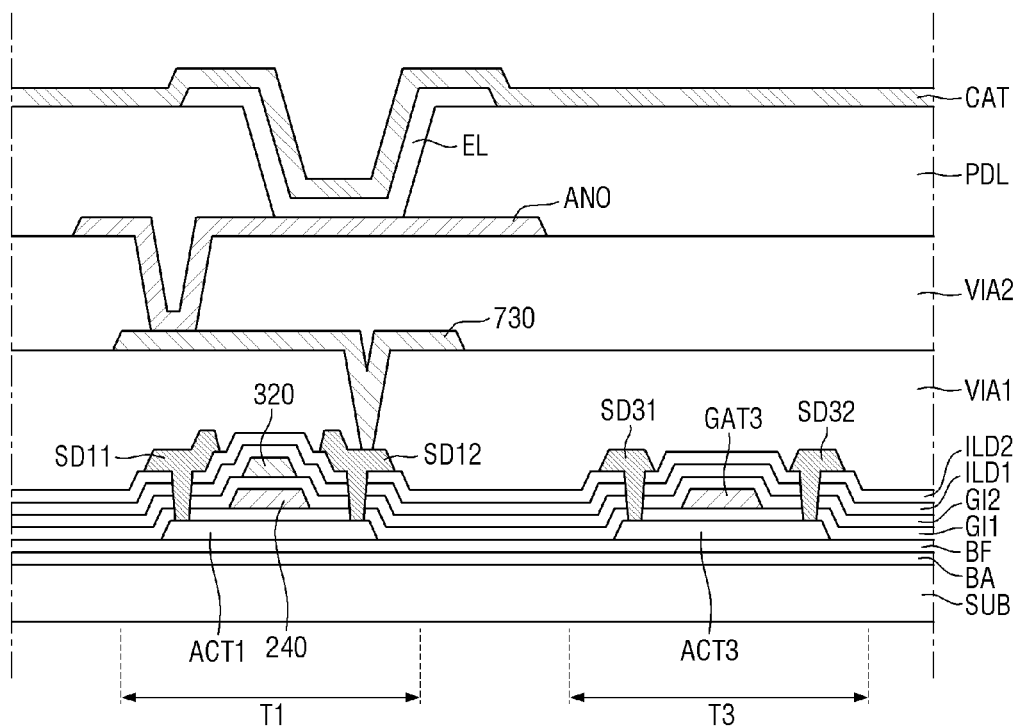
FIG. 6 is a cross-sectional view of a display device according to an embodiment.
Figure 7:
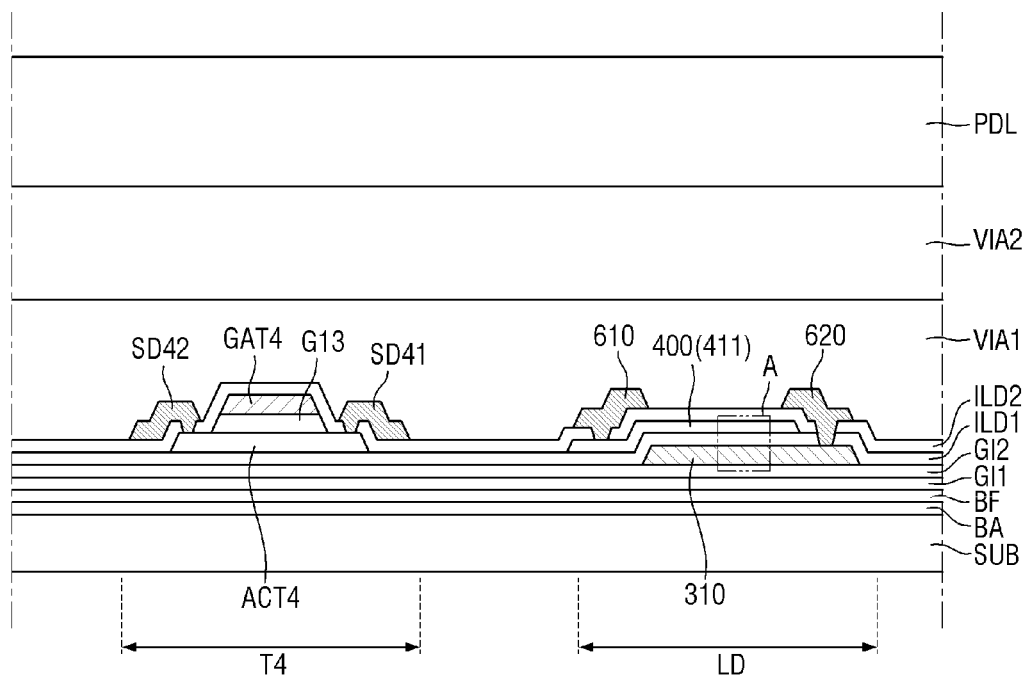
FIG. 7 is a cross-sectional view of a display device according to an embodiment.

FIG. 4 is a layout view of one pixel of a display device according to an embodiment. FIG. 5 is a layout view of a first semiconductor layer and a second semiconductor layer in FIG. 4 according to an embodiment. Each of FIGS. 6 and 7 is a cross-sectional view of a display device according to an embodiment. FIG. 6 illustrates cross-sections of the first transistor T1 and the third transistor T3 of FIG. 4 according to an embodiment, and FIG. 7 illustrates cross-sections of the fourth transistor T4 and the leakage prevention diode LD of FIG. 4 according to an embodiment.

Referring to FIGS. 3 to 7, a pixel includes transistors T1 to T7, a storage capacitor Cst, and an organic light emitting diode OLED.

Each of the transistors T1 to T7 includes a conductive layer forming an electrode, a semiconductor layer forming a channel, and an insulating layer. Each of the transistors T1 to T7 may be a top gate-type transistor in which a gate electrode is disposed above a semiconductor layer. The semiconductor layers of the PMOS transistors T1, T2, T3, T5, T6, and T7 may be arranged closer to or farther from a substrate SUB than the semiconductor layer of the NMOS transistor T4 is, and may include materials that are different from the material of the semiconductor layer of the NMOS transistor T4.

The storage capacitor Cst includes conductive layers constituting electrodes and an insulating layer disposed between the conductive layers. The organic light emitting diode OLED includes conductive layers forming an anode electrode and a cathode electrode, and an organic light emitting layer disposed between the two electrodes. The leakage prevention diode LD includes conductive layers forming a first electrode and a second electrode, and an insulating layer disposed between the two electrodes.

The electrical connections of the components may be performed by a set of wiring made of one or more conductive layers and/or a set of vias made of one or more conductive materials. The above-described conductive material(s), conductive layer(s), semiconductor layers, insulating layers, organic light emitting layer, etc. are disposed on the substrate SUB.

Layers of a pixel may be arranged in the order of a substrate SUB, a barrier layer BA, a buffer layer BF, a first semiconductor layer 100, a first gate insulating layer GI1, a first conductive layer 200, a second gate insulating layer GI2, a second conductive layer 300, a first interlayer insulating layer ILD1, a second semiconductor layer 400, a third gate insulating layer GI3, a third conductive layer 500, a second interlayer insulating layer ILD2, a fourth conductive layer 600, a first via layer VIA1, a fifth conductive layer 700, a second via layer VIA2, an anode electrode ANO of the organic light emitting diode OLED, a pixel defining layer PDL, light emitting layer EL, and a cathode electrode CAT of the organic light emitting diode OLED. Each of the above-described layers may be a single layer or a laminated layer including a plurality of layers. One or more additional layers may be further disposed between the layers.

The substrate SUB supports the above-described layers. When the display device is a back or double-sided light emission type display device, a transparent substrate may be used. When the o display device is a front emission type display device, not only a transparent substrate but also a translucent or opaque substrate may be used.

The substrate SUB may be made of an insulating material such as glass, quartz, or polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination of some of the above materials. The substrate SUB may also include a metal material.

The substrate SUB may be a rigid substrate or a flexible substrate capable of bending, folding, rolling, or the like. An example of the material constituting the flexible substrate may be polyimide (PI).

The barrier layer BA may be disposed on the substrate SUB. The barrier layer BA may prevent the diffusion of impurity ions, may prevent the penetration of moisture or outside air, and may perform a surface planarization function. The barrier layer BA may include silicon nitride, silicon oxide, or silicon oxynitride. The barrier layer BA may be optional depending on the type or process conditions of the substrate SUB.

The buffer layer BF may be disposed on the barrier layer BA. The buffer layer BF may planarize the upper portion of the substrate SUB, and may improve adhesion force to components disposed on the buffer layer BF. The buffer layer BF may include at least one of silicon nitride, silicon oxide, and silicon oxynitride. The buffer layer BF may be optional depending on the type or process conditions of the substrate SUB.

The first semiconductor layer 100 may be disposed on the buffer layer BF. The first semiconductor layer 100 may include active layers that provide the channels of the first transistor T1, the second transistor T2, the third transistor T3, the fifth transistor T5, the sixth transistor T6, and the seventh transistor T7. The first semiconductor layer 100 may include an active layer ACT1 of the first transistor T1 and an active layer ACT3 of the third transistor T3. The first semiconductor layer 100 may include active layers of the second transistor T2, the fifth transistor T5, the sixth transistor T6, and the seventh transistor T7, respectively.

The first semiconductor layer 100 include in one pixel may be separated from the first semiconductor layer 100 included in another pixel. The first semiconductor layer 100 may have a specific pattern in a plan view. For example, the first semiconductor layer 100 may include a first vertical portion 110, a second vertical portion 120, and a third vertical portion 160, which extend substantially in the second direction DR2; and may include a first horizontal portion 130, a second horizontal portion 140, and a third horizontal portion 150, which extend substantially in the first direction DR1. The first vertical portion 110, the second vertical portion 120, the third vertical portion 160, the first horizontal portion 130, the second horizontal portion 140, and the third horizontal portion 150 may be physically connected to each other.

The first vertical portion 110 may be disposed adjacent/close to the left side of the pixel, and the second vertical portion 120 may be disposed adjacent/close to the right side of the pixel. The first vertical portion 110 and the second vertical portion 120 may be spaced apart from each other. The first vertical portion 110 may be longer than the second vertical portion 120 in the second direction DR2.

The first horizontal portion 130 may connect the first vertical portion 110 and the second vertical portion 120. The first horizontal portion 130 may connect the first vertical portion 110 and the second vertical portion 120 with the shortest length. The first horizontal portion 130 may include a first bent portion 131 at the left side of the first horizontal portion 130 and a second bent portion 132 at the right side of the first horizontal portion 130. The total length of the first horizontal portion 130 may be increased by including more bends in the first horizontal portion 130.

The upper portions 111 and 121 of the first vertical portion 110 and the second vertical portion 120 may be located farther from the bending area BA than the first horizontal portion 130. The lower portions 112 and 122 may be located closer to the bending area BA than the first horizontal portion 130.

The second horizontal portion 140 may extend from the lower portion 112 of the first horizontal portion 110 in the first direction DR1. The third horizontal portion 150 may extend from the lower portion 122 of the second vertical portion 120 in the first direction DR1. The second horizontal portion 140 and the third horizontal portion 150 may face each other and be substantially aligned with each other. The third vertical portion 160 may extend from the third horizontal portion 150 in the second direction DR2. The third vertical portion 160 may protrude from the third horizontal portion 150 toward the bending area BA.

The channel of the first transistor T1 may be disposed in the first horizontal portion 130. The channel of the second transistor T2 may be disposed in the upper portion 111 of the first vertical portion 110, and the channel of the fifth transistor T5 may be disposed in the lower portion 112 of the first vertical portion 110. The channel of the third transistor T3 may be disposed in the upper portion 121 of the second vertical portion 120, and the channel of the sixth transistor T6 may be disposed in the lower portion 122 of the second vertical portion 120. The channel of the seventh transistor T7 may be disposed on the third vertical portion 160.

The first semiconductor layer 100 may include polycrystalline silicon. Polycrystalline silicon may be formed by crystallizing amorphous silicon. Examples of the crystallization method may include rapid thermal annealing (RTA), solid phase crystallization (SPC), excimer laser annealing (ELA), metal induced crystallization (MIC), metal induced lateral crystallization (MILC), and sequential lateral solidification (SLS). The first semiconductor layer 100 may include single crystal silicon, low-temperature polycrystalline silicon, amorphous silicon, or the like.

In the first semiconductor layer 100, a region (source/drain region) connected to each source/drain electrode of each of the transistors T1, T2, T3, T5, T6, and T7 may be doped with impurity ions (e.g., p-type impurity ions for each PMOS transistor). For example, a trivalent dopant such as boron (B) may be used as a p-type impurity ion.

The active layer ACT3 of the third transistor T3 and the active layer ACT1 of the first transistor T1 may be disposed directly on the same surface (or face) of the buffer layer BF and may be included in the first semiconductor layer 100. As the active layer ACT3 of the third transistor T3 is part of the first semiconductor layer 100, the active layer ACT3 of the third transistor T3 may include polycrystalline silicon.

The third transistor T3 may have electron mobility higher than that a transistor including an oxide semiconductor, and the threshold voltage deviation of the first transistor T1 may be smoothly compensated for even if one pixel operates under a high-speed driving environment of 120 Hz or higher.

The first gate insulating layer GI1 may be disposed on the first semiconductor layer 100, and may be disposed over an entire face of the substrate SUB. The first gate insulating layer GI1 may be a gate insulating layer for insulating gate electrodes from active layers.

The first gate insulating layer GI1 may include a silicon compound, a metal oxide, or the like. For example, the first gate insulating layer GI1 may include one or more of silicon oxide, silicon nitride, silicon oxynitride, aluminum oxide, tantalum oxide, hafnium oxide, zirconium oxide, and titanium oxide, used alone or in combination.

The first conductive layer 200 is disposed on the first gate insulating layer GI1. The first conductive layer 200 may include a first scan line 210 transmitting a first scan signal GW, a first light emission control line 220 transmitting a light emission control signal EM, a third scan line 230 supplying a third scan signal GB, and a gate electrode 240 of the first transistor T1.

The first scan line 210 includes a gate electrode of the second transistor T2. The first light emission control line 220 may include a gate electrode (not shown) of the fifth transistor T5 and a gate electrode of the sixth transistor T6. The third scan line 230 may include a gate electrode of the seventh transistor T7.

Each of the first scan line 210, the first light emission control line 220, and the third scan line 230 may extend in the first direction DR1. Each of the first scan line 210, the first light emission control line 220, and the third scan line 230 may extend to neighboring pixels beyond the boundary of the pixels in the first direction DR1.

The first scan line 210 may be located at/near the center of the pixel. The first scan line 210 may overlap the upper portion 111 of the first vertical portion 110 of the first semiconductor layer 100 and the upper portion 121 of the second vertical portion 120 of the first semiconductor layer 100, and may form a gate electrode of the second transistor T2 and a gate electrode of the third transistor T3 at the corresponding overlapping portions.

A first part of the first vertical portion 110 of the first semiconductor layer 100 may be located from the bending area BA than the overlap of the first scan line 210 and the upper portion 111 of the first vertical portion 110 and may be a first electrode region of the second transistor T2. A second part of the first vertical portion 110 of the first semiconductor layer 100 may be located closer to the bending area BA than the overlap of the first scan line 210 and the upper portion 111 of the first vertical portion and may be a second electrode region of the second transistor T2. A first part of the second vertical portion 120 of the first semiconductor layer 100 may be located closer to the bending are BA than the overlap of the first scan line 210 and the upper portion 121 of the second vertical portion 120 may be a first electrode region of the third transistor T3. A second part of the second vertical portion 120 of the first semiconductor layer 100 may be located farther from the bending are BA than the overlap of the first scan line 210 and the upper portion 121 of the second vertical portion 120 may be a second electrode region of the third transistor T3.

The first light emission control line 220 may be located closer to the bending area BA than the first scan line 210 and may overlap the lower portion 112 of the first vertical portion 110 of the first semiconductor layer 100 and the lower portion 122 of the second vertical portion 120 of the first semiconductor layer 100.

The first light emission control line 220 may form a gate electrode of the fifth transistor T5 at a portion overlapping the lower portion 112 of the first vertical portion 110 of the first semiconductor layer 100. A part of the first vertical portion 110 of the first semiconductor layer 100 may be located farther from the bending area BA than the overlapping portion and may be a second electrode region of the fifth transistor T5. A part of the first vertical portion 110 of the first semiconductor layer 100 may be located closer to the bending area BA than the overlapping portion and may be a first electrode region of the fifth transistor T5.

The first light emission control line 220 may form a gate electrode of the sixth transistor T6 at a portion overlapping the lower portion 122 of the second vertical portion 120 of the first semiconductor layer 100. A part of the second vertical portion 120 of the first semiconductor layer 100 may be located farther from the bending area BA than the overlapping portion and may be a first electrode region of the sixth transistor T6. A part of the second vertical portion 120 of the first semiconductor layer 100 may be located closer to the bending area BA than the overlapping portion and may be a second electrode region of the sixth transistor T6.

The third scan line 230 may be located closer to the bending area BA than the first light emission control line 220. The third scan line 230 may overlap the third vertical portion 160 of the first semiconductor layer 100. The third scan line 230 may form a gate electrode of the seventh transistor T7 at a portion overlapping the third vertical portion 160 of the first semiconductor layer 100. A part of the third vertical portion 160 of the first semiconductor layer 100 may be located farther from the bending area BA than the overlapping portion and may be a second electrode region of the seventh transistor T7. A part of the third vertical portion 160 of the first semiconductor layer 100 may be located closer to the bending area BA than the overlapping portion and may be a first electrode region of the seventh transistor T7.

The gate electrode 240 of the first transistor T1 may be located at/near the center of the pixel. The gate electrode 240 of the first transistor T1 may be located between the first scan line 210 and the first light emission control line 220 in a plan view. The gate electrodes 240 of the first transistors T1 for different pixels PX may be spaced from each other.

The gate electrode 240 of the first transistor T1 overlaps the first horizontal portion 130 of the first semiconductor layer 100. A part of the first horizontal portion 130 of the first semiconductor layer 100 may be located closer to the first vertical portion 110 than the overlapping portion and may be a first electrode region of the first transistor T1. A part of the first horizontal portion 130 of the first semiconductor layer 100 may be located closer to the second vertical portion 120 than the overlapping portion and may be a second electrode region of the first transistor T1.

The first conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The second gate insulating layer GI2 may be disposed on the first conductive layer 200 and may be disposed over an entire face of the substrate SUB. The second gate insulating layer GI2 may insulate the first conductive layer 200 from the second conductive layer 300. The second gate insulating layer GI2 may be an interlayer insulating layer. The second gate insulating layer GI2 may include substantially the same material as the first gate insulating layer GI1.

The second conductive layer 300 is disposed directly on the second gate insulating layer GI2. The second conductive layer 300 may include a first electrode 310 of the leakage prevention diode LD and a second electrode 320 of the storage capacitor Cst.

The first electrode 310 of the leakage prevention diode LD may be located farther from the bending area BA than the upper portion 121 of the second vertical portion 120 of the first semiconductor layer 100. The first electrode 310 of the leakage prevention diode LD may be located at the right side of the pixel in a plan view. The first electrodes 310 of the leakage prevention diodes LD of different pixels may be spaced from each other.

The second electrode 320 of the storage capacitor Cst may be located at/near the center of the pixel. The second electrode 320 of the storage capacitor Cst may be located between the first scan line 210 and the first light emission control line 220 in a plan view. The second electrodes 320 of the storage capacitors Cst of different pixels may be spaced from each other.

The second electrode 320 of the storage capacitor Cst may overlap the gate electrode 240 of the first transistor T1 in the thickness direction DR3. The gate electrode 240 of the first transistor T1 may extend from a region overlapping the first semiconductor layer 100 to form a first electrode of the storage capacitor Cst that overlaps the second electrode 320 of the storage capacitor Cst in the thickness direction DR3. The gate electrode 240 of the first transistor T1 may be directly connected to the first electrode of the capacitor Cst. The first electrode of the storage capacitor Cst may be part of the gate electrode 240 of the first transistor T1 or may be a portion extending from the upper portion 111. The second electrode 320 of the storage capacitor Cst may include an opening partially exposing the gate electrode 240 of the first transistor T1.

The first interlayer insulating layer ILD1 may be disposed on the second conductive layer 300 to cover the second conductive layer 300. The first interlayer insulating layer ILD1 may be disposed over an entire face of the substrate SUB. The first interlayer insulating layer ILD1 may insulate the second conductive layer 300 from the second semiconductor layer 400. The first interlayer insulating layer ILD1 may be an interlayer insulating layer. The thickness of the first interlayer insulating layer ILD1 in the thickness direction DR3 may be less than or equal to 100 nm. For example, the thickness of the first interlayer insulating film ILD1 may be in the range of 1 nm to 100 nm, in the range of 20 nm to 80 nm, or in the range of 40 nm to 60 nm.

The first interlayer insulating layer ILD1 may include a silicon compound, a metal oxide, or the like. The first interlayer insulating layer ILD1 may include one or more of silicon oxide, silicon nitride, silicon oxynitride, aluminum oxide, tantalum oxide, hafnium oxide, zirconium oxide, and titanium oxide, used alone or in combination.

The second semiconductor layer 400 is disposed on the first interlayer insulating layer ILD1. The second semiconductor layer 400 may include an active layer ACT4 providing a channel of the fourth transistor T4.

The second semiconductor layer 400 may include an oxide semiconductor. For example, the second semiconductor layer 400 may include a two-component compound (ABx), a three-component compound (ABxCy), and a four-component compound (ABxCyDz), each containing one or more of indium, zinc, gallium, tin, titanium, aluminum, hafnium (Hf), zirconium (Zr), and magnesium (Mg). In an embodiment, the second semiconductor layer 400 may include ITZO (oxide including indium, tin, and titanium) or IZO (oxide including indium, gallium, and tin).

Most region of the second semiconductor layer 400 may be doped with impurity ions (e.g., n-type impurity ions for an NMOS transistor). For example, a trivalent dopant such as phosphorus (P) may be used as an n-type impurity ion. Accordingly, most region of the second semiconductor layer 400 doped with n-type impurity ions may have low electrical resistance and high conductivity, and thus may behave like a conductive material. In the second semiconductor layer 400, the channel region of the fourth transistor T4 may not be doped, or may have a relatively small doped concentration.

The second semiconductor layers 400 for different pixels may be spaced from each other. The second semiconductor layer 400 may be disposed farther from the bending area BA than the first semiconductor layer 100 in a plan view. The second semiconductor layer 200 may have a specific pattern/structure in a plan view. For example, the second semiconductor layer 400 may include a horizontal portion 410 extending in the first direction DR1 and may include a vertical portion 420 extending from one end of the horizontal portion 410 in the second direction DR2.

A channel of the fourth transistor T4 may be part of the vertical portion 420 of the second semiconductor layer 400 that overlaps the gate electrode of the fourth transistor T4. The horizontal portion 410 of the second semiconductor layer 400 may overlap the first electrode 310 of the leakage prevention diode LD in the thickness direction DR3. The part of the horizontal portion 410 of the second semiconductor layer 400 that overlaps the first electrode 310 of the leakage prevention diode LD may include/be the second electrode 411 of the leakage prevention diode LD. The first interlayer insulating layer ILD1 may be interposed between the electrodes 310 and 411 of the leakage prevention diode LD.

Figure 8:
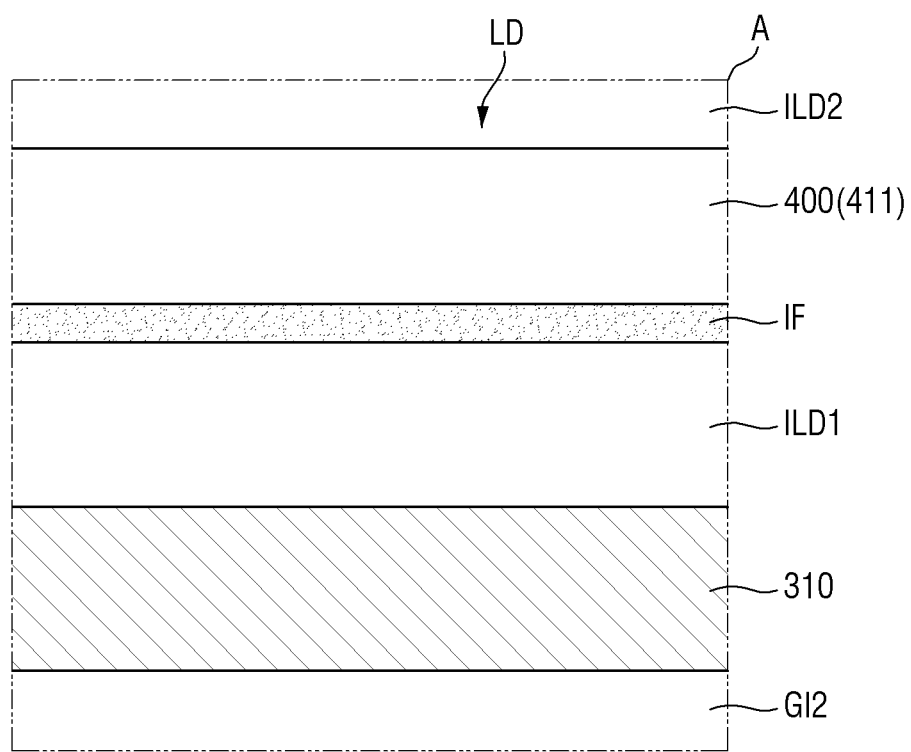
FIG. 8 is a view of the area A in FIG. 7 according to an embodiment.

FIG. 8 is an enlarged view of the area A in FIG. 7 according to an embodiment. FIG. 8 illustrates a cross-sectional view of the leakage prevention diode LD.

Referring to FIG. 8, the display panel 10 may further include an interface layer IF. The interface layer IF may be disposed between the second semiconductor layer 400 and the first interlayer insulating layer ILD1. The interface layer IF may control electrons in the second semiconductor layer 400 to move to the first electrode 310 of the leakage prevention diode LD. The thickness of the interface layer IF may be less than or equal to 15 nm. For example, the thickness of the interface layer IF may be in the range of 1 nm to 15 nm, or may be in the range of 10 nm to 12 nm.

The interface layer IF may be formed by heat treatment or ultraviolet treatment of the second semiconductor layer 400. For example, the temperature at which the heat treatment is performed may be in the range of 25° C. to 350° C., or may be in the range of 200° C. to 350° C. When the heat treatment temperature is 25° C. or higher or 200° C. or higher, the interface layer IF may be formed easily, and when the heat treatment temperature is 350° C. or lower, an element may not deteriorate even if the heat treatment is performed. In the ultraviolet treatment, for example, ultraviolet rays of wavelength bands of 185 nm and 245 nm may be mixed and used.

Through the heat treatment or the ultraviolet treatment, metal elements in the second semiconductor layer 400 may move toward the interface layer IF, and oxygen in the second semiconductor layer 400 may move toward a direction opposite to the interface layer IF. As the metal elements approach the interface layer IF, the concentration of the metal elements in the second semiconductor layer 400 increases, and the metal concentration at and near the interface layer IF may be relatively high. The concentration of oxygen in the second semiconductor layer 400 may decrease as it approaches the interface layer IF.

The leakage prevention diode LD may include a first electrode 310, a first interlayer insulating layer ILD1, an interface layer IF, and a second electrode 411. In the leakage prevention diode LD, rectification characteristics occur between the first interlayer insulating layer ILD1 and the oxide semiconductor layer 400 (or the second electrode 411). For example, when a positive (+) voltage is applied to the second semiconductor layer 400 and a negative (−) voltage is applied to the first interlayer insulating layer ILD1, current does not flow, but when a negative (−) voltage is applied to the second semiconductor layer 400 and a positive (+) voltage is applied to the first interlayer insulating layer ILD1, a current flows to exhibit rectification characteristics.

In the leakage prevention diode LD, electrons may be moved by F-N tunneling (Fowler-Nordheim tunneling). F-N tunneling is one of the tunneling mechanisms through which electrons may move from a metal-insulator-metal to upper/lower metal, and refers to movement of electrons from the upper metal to the lower metal by tunneling through a shorter path because the thickness of the insulator to which electrons tunnel is thinned when an electric field of a certain size or more is applied to the insulator. The first electrode 310 of the leakage prevention diode LD includes a metal, and the second electrode 411 of the leakage prevention diode LD includes an oxide semiconductor. Since the second electrode 411 of the leakage prevention diode LD is doped with n-type impurity ions and has high conductivity, the tunneling mechanism may be applied.

Figure 9:
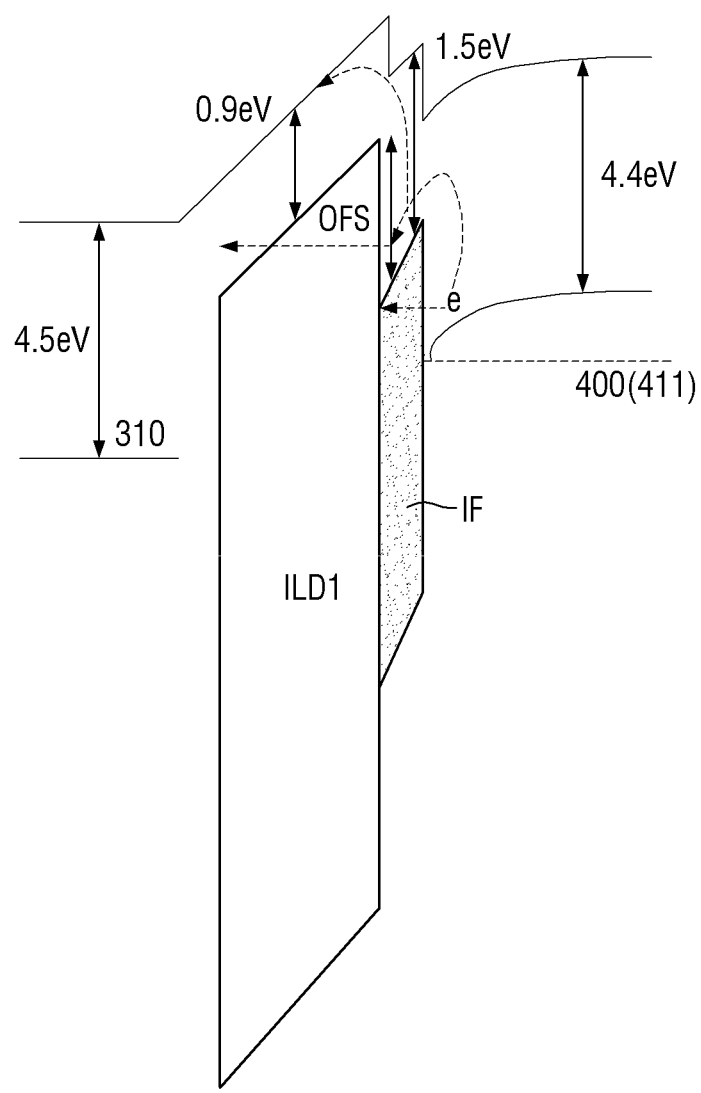
FIG. 9 illustrates a band diagram of a leakage prevention diode according to an embodiment.

FIG. 9 illustrates a band diagram of a leakage prevention diode according to an embodiment.

Referring to FIG. 9, the interface layer IF may be formed by heat treatment or ultraviolet treatment. When the heat treatment or ultraviolet treatment is performed, the interface layer IF having smaller band gap energy than the first interlayer insulating layer ILD1 is formed between the first interlayer insulating layer ILD1 and the second electrode 411 of the leakage prevention diode LD.

In the leakage prevention diode LD, since an offset OFS is lowered by the interface layer IF, when a voltage is applied to the leakage prevention diode LD, a current may flow from the second electrode 411 of the leakage prevention diode LD to the first electrode 310 of the leakage prevention diode LD. The size of the offset OFS between the first interlayer insulating film ILD1 and the second electrode 411 of the leakage prevention diode LD may be reduced by the interface layer IF, and thus electrons in the second electrode 411 of the leakage prevention diode LD may move to the first electrode 310 of the leakage prevention diode LD.

The offset OFS between the interface layer IF and the first interlayer insulating layer ILD1 may be in the range of 0.6 eV to 1.5 eV depending on the degree of electron trap. For example, the offset OFS between the interface layer IF and the first interlayer insulating layer ILD1 may be 0.6 eV. The interface layer IF may have an electron affinity of 1.5 eV, the first interlayer insulating layer ILD 1 may have an electron affinity of 0.9 eV, and the second electrode 411 of the leakage prevention diode LD may have an electron affinity of 4.4 eV. An offset (not shown) between the second electrode 411 of the leakage prevention diode LD and the interface layer IF may be 2.9 eV.

Accordingly, since the offset OFS between the first interlayer insulating film ILD1 and the second electrode 411 of the leakage prevention diode LD is reduced to 0.6 eV by the interface layer IF, when a voltage is applied to the leakage prevention diode LD, due to a small barrier height of 0.6 eV, electrons may be easily moved to the first electrode 310 of the leakage prevention diode LD. The offset OFS between the interface layer IF and the first interlayer insulating layer ILD1 may have a value between values associated with the second electrode 411 of the leakage prevention diode LD and the first interlayer insulating layer ILD1.

The leakage prevention diode LD may have an MSIM (Metal-Semiconductor-Insulator-Metal) structure, and the interface layer IF may help electrons move under forward-bias conditions. The interface layer IF may enable/facilitate direct tunneling and/or F-N tunneling. Further, it is possible to control the movement of electrons in the second electrode 411 of the leakage prevention diode LD to the first electrode 310 of the leakage prevention diode LD by changing the thicknesses and materials of the first interlayer insulating layer ILD1 and the second electrode 411 of the leakage prevention diode LD.

Figure 10:
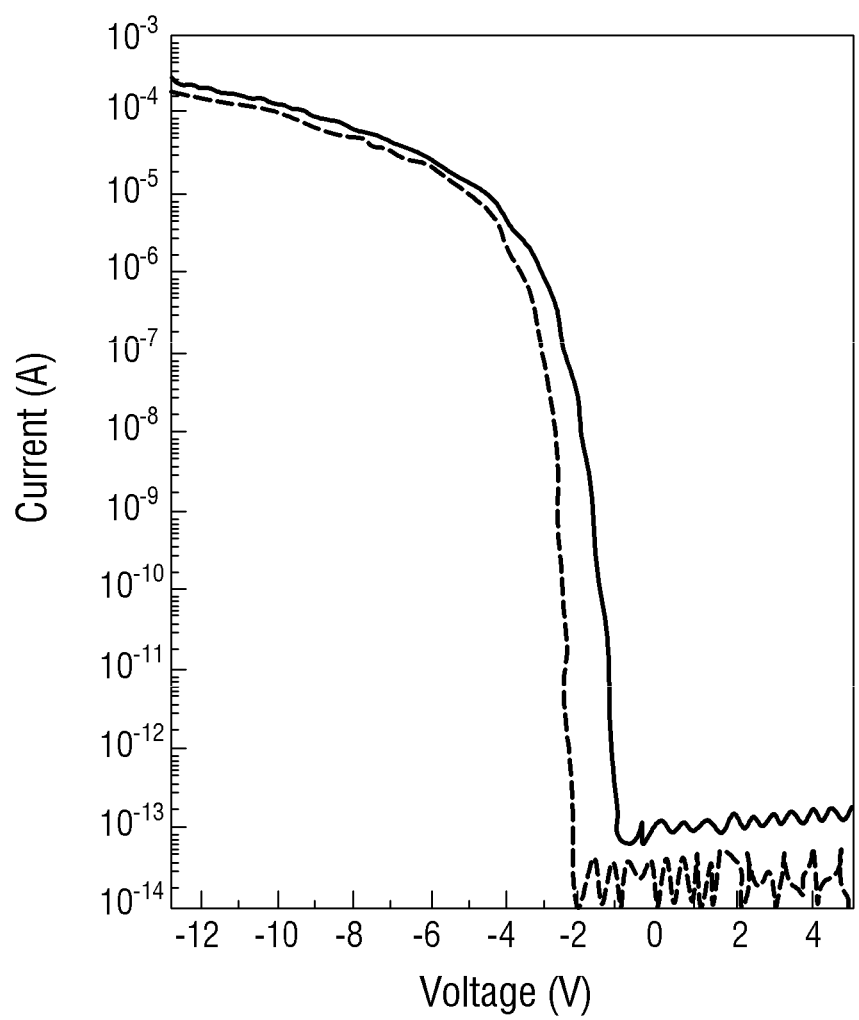
FIG. 10 is a graph illustrating a change in current of a leakage prevention diode with respect to a bias voltage according to an embodiment.

FIG. 10 is a graph illustrating a change in current of a leakage prevention diode with respect to a bias voltage according to an embodiment, wherein the first interlayer insulating layer ILD1 may include silicon oxide (SiOx), and wherein the first interlayer insulating layer ILD1 may have a thickness in a range of 60 nm and 40 nm.

Referring to FIG. 10, when a forward bias (negative bias) based on 0 V is applied to the second electrode 411 of the leakage prevention diode LD, the second electrode 411 is in an "accumulation" state, so that electrons are collected between the insulating layer (first interlayer insulating layer ILD1) and the second electrode 411 of the leakage prevention diode LD, and the collected electrons overflows the barrier of the insulating layer (first interlayer insulating layer ILD1) by the interface layer IF and move to the first electrode 310 (resulting in an on current from the first electrode 310 to the second electrode 411).

When a reverse bias (positive bias) based on 0 V is applied to the second electrode 411 of the leakage prevention diode LD, the second electrode 411 is in a "depletion" state. Unlike in the forward bias state, the interface layer IF does not exist between the first electrode 310 and the insulating layer (first interlayer insulating layer ILD1) when electrons move from the first electrode 310 to the second electrode 411, so that electrons are prevented from flowing (resulting minimum off current from the second electrode 411 to the first electrode 310), according to the resistance state of the insulating layer (first interlayer insulating layer ILD1) and the second electrode 411 of the leakage prevention diode LD in the depletion state.

As the thickness of the insulating layer (first interlayer insulating film ILD1) increases, a current value increases, so that the absolute value of Von (voltage at which the diode is turned on) increases, and simultaneously the on/off current of the leakage prevention diode LD decreases. The on/off current of the leakage preventing diode LD may be adjusted by configuring the thickness of the insulating layer (first interlayer insulating layer ILD1).

In the leakage prevention diode LD, a current may flow only in one direction from the first electrode 310 of the leakage prevention diode LD toward the second electrode 411. As the leakage preventing diode LD is disposed between the second source/drain electrode of the third transistor T3 and the gate electrode of the first transistor T1, it is possible to minimize or prevent the leakage of a driving current during the light emission period of the organic light emitting diode OLED, and it is possible to minimize or prevent the leakage of a current intended for the gate electrode of the first transistor T1. Accordingly, even when the active layer of the third transistor T3 includes part of the first semiconductor layer 100, the leakage prevention diode LD may minimize or prevent the leakage of a current together with the fourth transistor T4.

As the active layer of the third transistor T3 includes part of the first semiconductor layer 100, even when a period during which a threshold voltage can be charged under a high-speed driving environment of 120 Hz or higher is shortened, the threshold voltage deviation of the first transistor T1 may be easily compensated for. Accordingly, it is possible to minimize or prevent a defect that may occur in the luminance of an image displayed by the display device 1 (refer to FIG. 1) operating under a high-speed driving environment of 120 Hz or higher. Even when the active layer of the third transistor T3 is part of the first semiconductor layer 100, the leakage of a current may be more easily minimized or prevented by further providing the leakage prevention diode LD.

The leakage prevention diode LD may be driven under an excessive reverse bias condition, and the leakage prevention diode LD may be used as an electrostatic discharge (ESD) protection diode.

The characteristics of the leakage prevention diode LD may be adjusted depending on a process condition of forming the second semiconductor layer 400 as well as thickness of the insulating layer (first interlayer insulating layer ILD1) and the thickness of the second electrode 411 of the leakage prevention diode LD.

Figure 11:
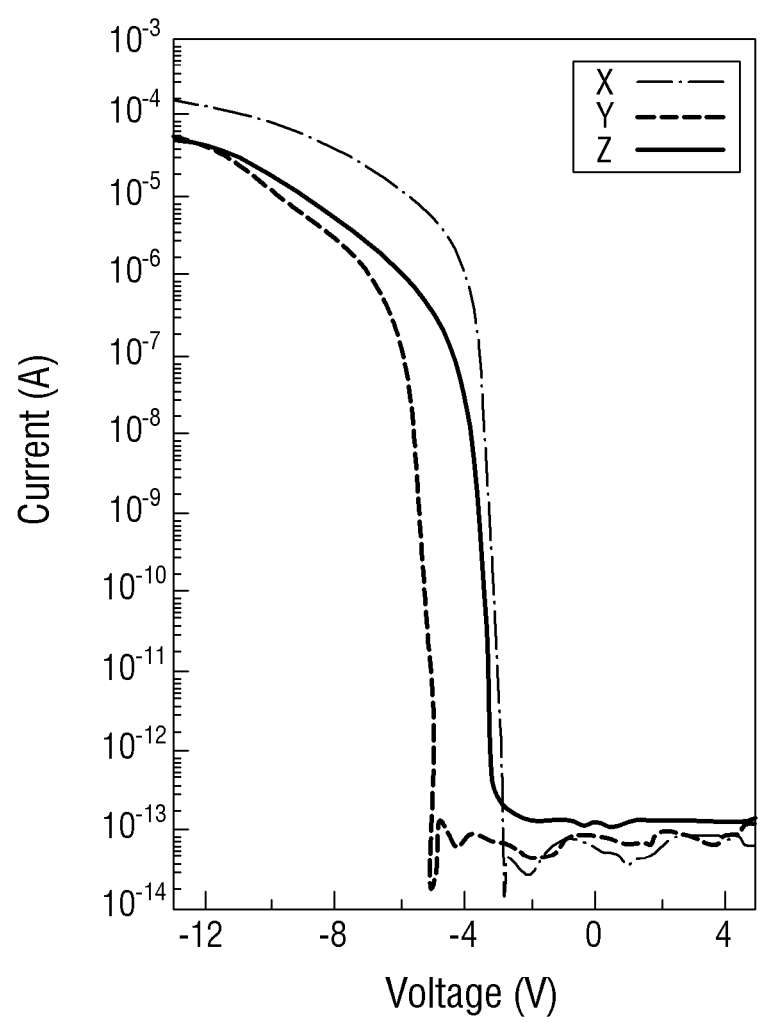
FIG. 11 includes graphs illustrating a change in current of a leakage prevention diode with respect to a bias voltage depending on process conditions.

FIG. 11 includes graphs illustrating a change in current of a leakage prevention diode with respect to a bias voltage depending on process conditions. In FIG. 11, each of graphs X, Y, and Z is related to a leakage prevention diode LD in which the thickness of the second electrode 411 (i.e., the thickness of the second semiconductor layer 400) is 40 nm.

Referring to FIG. 11, for example, the second semiconductor layer 400 may be formed by physical vapor deposition (PVD), such as sputtering. The sputtering power may be maintained or changed while the second semiconductor layer 400 is stacked.

Graph X illustrates a case where the sputtering power is maintained at 40 W while the second semiconductor layer 400 is stacked, graph Y illustrates a case where the sputtering power is increased from 20 W to 40 W while the second semiconductor layer 400 is stacked, and graph Z illustrates a case where the sputtering power is decreased from 40 W to 20 W while the second semiconductor layer 400 is stacked. Graph Y illustrates a case where the lower portion (having a 10 nm thickness) of the second semiconductor layer 400 is formed by a sputtering power of 20 W, and the remaining upper portion (having a 30 nm thickness) of the second semiconductor layer 400 is formed by a sputtering power of 40 W. Graph Z indicates a case where the lower portion (30 nm) of the second semiconductor layer 400 is formed by a sputtering power of 40 W, and the remaining upper portion (10 nm) of the second semiconductor layer 400 is formed by a sputtering power of 20 W.

Graph X and Graph Z generally trend to be significantly similar/close to each other, but Graph Y trends to be significantly different/away from Graph X and Graph Z. Graph Y is negatively shifted from graph X and graph Z. When the second electrode 411 of the leakage prevention diode LD is formed by a sputtering method, in the second electrode 411 of the leakage prevention diode LD, the on-off characteristics of the leakage prevention diode LD may be adjusted according to the sputtering power in the process of forming a portion in direct contact with the first interlayer insulating layer ILD1 as an insulator. In the initial deposition of the second electrode 411 of the leakage prevention diode LD, the on-off characteristic of the leakage prevention diode LD may be adjusted according to the sputtering power.

Referring to FIGS. 4 to 7 again, the third gate insulating layer GI3 is disposed on the second semiconductor layer 400. Unlike the first gate insulating layer GI1, the third gate insulating layer GI3 may only partially overlap the substrate SUB. The third gate insulating layer GI3 may cover the channel region of the fourth transistor T4 and may expose the first and second source/drain regions of the fourth transistor T4 and side surfaces of the second semiconductor layer 400. The third gate insulating layer GI3 may have substantially the same pattern shape as the third conductive layer 500 in a plan view. The third gate insulating layer GI3 may include substantially the same material as the first gate insulating layer GI1.

The third conductive layer 500 is disposed on the third gate insulating layer GI3. The third conductive layer 500 may include an initialization line 510 that transmits an initialization voltage VINT (in FIG. 3) and a second scan line 520 that transmits a second scan signal GI (in FIG. 3).

The initialization line 510 and the second scan line 520 may each extend in the first direction DR1. The initialization line 510 and the second scan line 520 may extend to neighboring pixels across boundaries between the pixels in the first direction DR1. The second scan line 520 may not overlap the first semiconductor layer 100.

The initialization line 510 may be located farther from the bending area BA than the semiconductor layer 100 in a plan view. The initialization line 510 may be located farther from the bending area BA than the first scan line 210 in a plan view. In one pixel, the initialization line 510 may include separate sections that are spaced from each other, and the vertical portion 420 of the second semiconductor layer 400 in a plan view may be positioned between the separate sections of the initialization lines 510. In one pixel, the separate sections of the initialization line 510 may be electrically connected by an overlapping fifth data pattern 650.

The initialization line 510 may overlap the third vertical portion 160 of the first semiconductor layer 100 in the thickness direction DR3. The third vertical portion 160 of the first semiconductor layer 100 may extend toward the bending area BA, may overlap each of the third scan line 230 and the initialization line 510.

In the region where the initialization line 510 overlaps the third vertical portion 160 of the first semiconductor layer 100 in the thickness direction (third direction DR3), the initialization line 510 may contact or may be contacted by the third vertical portion 160 of the first semiconductor layer 100 through a contact hole CNT15 that penetrates the first interlayer insulating layer ILD1, the second gate insulating layer GI2, and the first gate insulating layer GI1 to expose the third vertical portion 160 of the first semiconductor layer 100. The initialization line 510 may be electrically connected to the third vertical portion 160 of the first semiconductor layer 100 through the contact hole CNT15.

The second scan line 520 may be located farther from the bending area BA than the first scan line 210 in a plan view. A portion of the second scan line 520 may overlap the vertical portion 420 of the second semiconductor layer 400 and may form a gate electrode GAT4 of the fourth transistor T4. Based on the overlapping portion of the second scan line 520 that overlaps the vertical portion 420 of the second semiconductor layer 400, a part of the vertical portion 420 of the second semiconductor layer 400 that is located farther from the bending area BA than the overlapping portion in a plan view may become a second electrode region of the fourth transistor T4, and a part of the vertical portion 420 of the second semiconductor layer 400 that is located closer to the bending area BA than the overlapping portion in a plan view may become a first electrode region of the fourth transistor T4.

The third conductive layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The second interlayer insulating layer ILD2 may be disposed on the third conductive layer 500 and may substantially/completely cover a face of the third conductive layer 500. The second interlayer insulating layer ILD2 may substantially/completely overlap a face of the substrate SUB. The second interlayer insulating layer ILD2 may insulate the third conductive layer 500 from the fourth conductive layer 600. The second interlayer insulating layer ILD2 may be an interlayer insulating layer. The second interlayer insulating layer ILD2 may include substantially the same material as the first interlayer insulating layer ILD2.

The fourth conductive layer 600 may be disposed on the second interlayer insulating layer ILD2. The fourth conductive layer 600 may include first to sixth data patterns/members (or connection patterns/members) 610, 620, 630, 640, 650, and 660. The data patterns 610, 620, 630, 640, 650, and 660 are physically spaced apart from each other. The data patterns 610, 620, 630, 640, 650, and 660 may electrically connect portions spaced apart from each other.

The fourth conductive layer 600 may include first and second electrodes of each of the transistors T1 to T7. As examples, the fourth conductive layer 600 includes the first and second electrodes SD11 and SD12 of the first transistor T1, the first and second electrodes SD31 and SD32 of the third transistor T3, and the first and second electrodes SD41 and SD42 of the fourth transistor T4. Some of the data patterns/members may constitute at least one first electrode or second electrode of each of the transistors T1 to T7.

The first data pattern 610 may overlap the gate electrode 240 of the first transistor T1. The first data pattern 610 may be electrically connected to the gate electrode 240 of the first transistor T1 through the contact hole CNT1 in the overlapping region. The contact hole CNT1 may be located in an opening of the second electrode 320 of the storage capacitor Cst. A portion of the first data pattern/member 610 inside the contact hole CNT1 may be insulated from the second electrode 320 of the storage capacitor Cst by the second interlayer insulating layer ILD2.

The first data pattern 610 may extend in the second direction DR2 from the overlapping region with the gate electrode 240 of the first transistor T1, may be insulated from the first scan line 210, may intersect the first scan line 210, and may overlap and be insulated from the horizontal portion 410 of the second semiconductor layer 400. In an overlapping region, the first data pattern 610 may be electrically connected to the horizontal portion 410 of the second semiconductor layer 400 through a contact hole CNT2 that penetrates the second interlayer insulating layer ILD2 and exposes the second semiconductor layer 400.

The second data pattern/member 620 may overlap the upper portion 121 of the second vertical portion 120 of the first semiconductor layer 100. In the overlapping region, the second data pattern 620 may be electrically connected to the upper portion 121 of the second vertical portion 120 of the first semiconductor layer 100 through a contact hole CNT3 that penetrates the second interlayer insulating layer ILD2, the first interlayer insulating layer ILD1, the second gate insulating layer GI2, and the first gate insulating layer GI1 and exposes the upper portion 121 of the second vertical portion 120 of the first semiconductor layer 100.

The second data pattern 620 may extend in the second direction DR2 from the overlapping region with the upper portion 121 of the second vertical portion 120 of the first semiconductor layer 100 and may overlap the first electrode 310 of the leakage prevention diode LD. In the overlapping region with the first electrode 310, the second data pattern 620 may be electrically connected to the first electrode 310 of the leakage prevention diode LD through a contact hole CNT4 that penetrates the second interlayer insulating layer ILD2 and the first interlayer insulating layer ILD1 and exposes the first electrode 310 of the leakage prevention diode LD.

Accordingly, the first semiconductor layer 100 may be electrically connected to the first electrode 310 of the leakage prevention diode LD through the second data pattern 620.

The third data pattern/member 630 may overlap the upper portion 111 of the first vertical portion 110 of the underlying first semiconductor layer 100. In the overlapping region, the third data pattern 630 may be electrically connected to the upper portion 111 of the first vertical portion 110 of the first semiconductor layer 100 through a contact hole CNT5 that penetrates the second interlayer insulating layer ILD2, the first interlayer insulating layer ILD1, the second gate insulating layer GI2, and the first gate insulating layer GI1 and exposes the upper portion 111 of the first vertical portion 110 of the first semiconductor layer 100.

The third data pattern 630 may overlap the overlying data line 720. In the overlapping region, the data line 720 may be electrically connected to the third data pattern 630 through a contact hole CNT6 that penetrates the first via layer VIA1 and exposes the third data pattern 630.

Accordingly, the upper portion 111 of the first vertical portion 110 of the first semiconductor layer 100 may be electrically connected to the data line 720 through the third data pattern 630.

The fourth data pattern/member 640 may overlap the second electrode 320 of the underlying capacitor Cst. In the overlapping region, the fourth data pattern 640 may be electrically connected to the second electrode 320 of the capacitor Cst through a contact hole CNT7 that penetrates the second interlayer insulating layer ILD2 and the first interlayer insulating layer ILD1 and exposes the second electrode 320 of the capacitor Cst.

The fourth data pattern 640 may extend from the overlapping region with the second electrode 320 in the second direction DR2, may be insulated from the light emission control line 220, and may intersect the light emission control line 220. The fourth data pattern 640 may overlap the second horizontal portion 140 of the underlying first semiconductor layer 100. In the overlapping region, the fourth data pattern 640 may be electrically connected to the second horizontal portion 140 of the first semiconductor layer 100 through a contact hole CNT8 that penetrates the second interlayer insulating layer ILD2, the first interlayer insulating layer ILD1, the second gate insulating layer GI2, and the first gate insulating layer GI1 and exposes the second horizontal portion 140 of the first semiconductor layer 100.

The fourth data pattern 640 may overlap the overlying first power voltage line 710. In the overlapping region, the fourth data pattern 640 may be electrically connected to the first power voltage line 710 through a contact hole CNT9 that penetrates the first via layer VIA1 and exposes the fourth data pattern 640.

Accordingly, each of the second electrode 320 of the capacitor Cst and the second horizontal portion 140 of the first semiconductor layer 100 may be electrically connected to the data line 720 through the fourth data pattern 640.

The fifth data pattern 650 may overlap the vertical portion 420 of the underlying second semiconductor layer 400. In the overlapping region, the fifth data pattern 650 may be electrically connected to the vertical portion 420 of the second semiconductor layer 400 through a contact hole CNT10 that penetrates the second interlayer insulating layer ILD2 and exposes the vertical portion 420 of the second semiconductor layer 400.

The fifth data pattern 650 may extend from the overlapping region with the portion 420 in the first direction DR1, and may overlap two separate sections of an initialization line 510. In overlapping regions with the two separate sections of the initialization line 510, the fifth data pattern 650 may be electrically connected to the two separate sections of the initialization line 510 through contact holes CNT11 and CNT12 that penetrate the second interlayer insulating layer ILD2 and expose the separate sections of the initialization line 510.

Accordingly, the fifth data pattern 650 may electrically connect separate sections of the initialization line 510, and may electrically connect the initialization line 510 to the vertical portion 420 of the second semiconductor layer 400.

The sixth data pattern 660 may overlap the third horizontal portion 150 of the underlying first semiconductor layer 100. In the overlapping region, the sixth data pattern 660 may be electrically connected to the third horizontal portion 150 of the first semiconductor layer 100 through a contact hole CNT13 that penetrates the second interlayer insulating layer ILD2, the first interlayer insulating layer ILD1, the second gate insulating layer GI2, and the first gate insulating layer GI1 and exposes the third horizontal portion 150 of the first semiconductor layer 100.

The sixth data pattern 660 may extend from the overlapping region with the portion 150 in the second direction DR2 and may overlap the overlying connection electrode 730. In the overlapping region, the connection electrode 730 may be electrically connected to the sixth data pattern 660 through a contact hole CNT14 that penetrates the first via layer VIAL and exposes the sixth data pattern 660.

Accordingly, the sixth data pattern 660 may electrically connect the third horizontal portion 150 of the underlying first semiconductor layer 100 to the overlying connection electrode 730.

The fourth conductive layer 600 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fourth conductive layer 600 may be a single layer or may include multiple layers. For example, the fourth conductive layer 600 may be/include a laminated structure of Ti—Al—Ti, Mo—Al—Mo, Mo—AlGe—Mo, and/or Ti—Cu.

The first via layer VIA1 is disposed on the fourth conductive layer 600. The first via layer VIA1 may include an inorganic insulating material, or may include an organic insulating material such as acrylic resin (polyacrylate resin), epoxy resin, phenolic resin, polyamide resin, polyimide resin, unsaturated polyester resin, poly polyphenylene resin (polyphenylene ether resin), polyphenylene sulfide resin, or benzocyclobutene (BCB). When the first via layer VIA1 includes an organic insulating material, the upper surface of the first via layer VIA1 may be substantially flat despite an underlying step.

The fifth conductive layer 700 is disposed on the first via layer VIAL The fifth conductive layer 700 may include a first power voltage line 710 for supplying a first power voltage ELVDD (in FIG. 3), a data line 720 for transmitting a data signal DATA (in FIG. 3), and a connection electrode 730 for providing electrical connection between the anode electrode ANO of the organic light emitting diode OLED and the sixth data pattern 660.

The first power voltage line 710 and the data line 720 may extend in the second direction DR2. The first power voltage line 710 and the data line 720 may extend to neighboring pixels across boundaries of the pixels. For a pixel column extending in the second direction DR2, the first power voltage line 710 and the data line 720 are disposed substantially adjacent to the left side of the pixel column, and the power voltage line 710 may be disposed at the right side of the data line 720. A connection electrode 730 may be provided for each pixel, and may be disposed closer to the bending area BA than at least one of the lines 210 and 220 in a plan view.

The electrical connection relationships between the first power voltage line 710, the data line 720, and the connection electrode 730 are described above.

The second via layer VIA2 is disposed on the fifth conductive layer 700. The second via layer VIA2 may include substantially the same material as the first via layer VIA1. When the second via layer VIA2 includes an organic insulating material, the upper surface of the second via layer VIA2 may be substantially flat despite an underlying step.

The anode electrode ANO is disposed on the second via layer VIA2. A separate anode electrode ANO may be provided for each pixel. The anode electrode ANO may be electrically connected to the connection electrode 730 through a contact hole penetrating the second via layer VIA2 and exposing a part of the connection electrode 730.

The anode electrode ANO may have a laminated film structure in which a high-work-function material layer including Indium-Tin-Oxide (ITO), Indium-Zinc-Oxide (IZO), Zinc Oxide (ZnO), or Indium Oxide (In$_2$O$_3$) and a reflective material layer including silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca) or a combination of some of the metals are laminated. The high-work-function material layer may be disposed over the reflective material layer to be closer to the light emitting layer EL. The anode electrode ANO may have a multi-layer structure of ITO—Mg, ITO—MgF, ITO—Ag, or ITO—Ag—ITO.

The pixel defining layer PDL may be disposed on the anode electrode ANO. The pixel defining layer PDL may include an opening partially exposing the anode electrode ANO. The pixel defining layer PDL may include an organic insulating material and/or an inorganic insulating material. For example, the pixel defining layer PDL may include at least one of polyimide resin, acrylic resin, a silicon compound, and polyacrylic resin.

The light emitting layer EL may be disposed on a portion of the anode electrode ANO exposed by the pixel defining layer PDL. The light emitting layer EL may include an organic material layer. The organic material layer of the light emitting layer EL may include an organic light emitting layer, and may further include a hole injection/transport layer and/or an electron injection/transport layer.

The cathode electrode CAT may be disposed on the light emitting layer EL. The cathode electrode CAT may be a common electrode that is shared by multiple pixels PX.

The cathode electrode CAT may include a low-work-function material layer including Li, Ca, LiF—Ca, LiF—Al, Al, Mg, Ag, Pt, Pd, Ni, Au Nd, Jr, Cr, BaF, Ba, or a combination of some of some of the materials (for example, a combination of Ag and Mg). The cathode electrode CAT may further include a transparent metal oxide layer disposed on the low-work-function material layer.

The anode electrode ANO, the light emitting layer EL, and a corresponding portion of the cathode electrode CAT may constitute an organic light emitting diode OLED.

A thin film encapsulation layer including at least one inorganic film and at least one organic film may be disposed on the cathode electrode CAT. The thin film encapsulation layer may encapsulate each component of the pixel and may prevent penetration of outside air or moisture.

Figure 12:
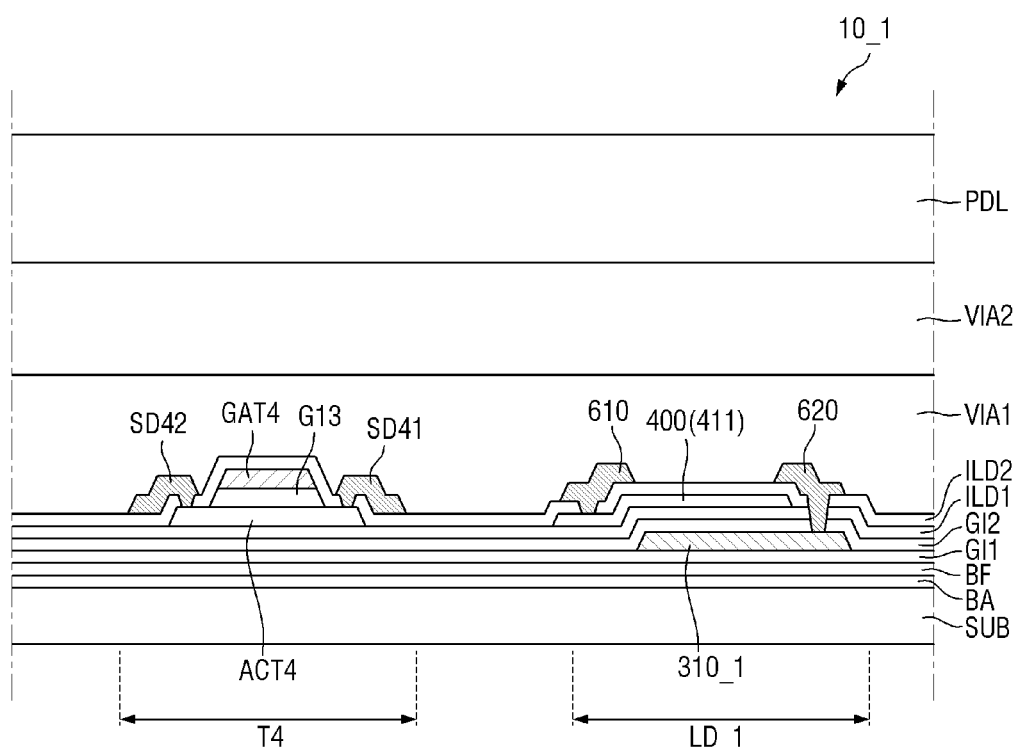
FIG. 12 is a cross-sectional view of a display panel of a display device according to an embodiment.

FIG. 12 is a cross-sectional view of a display panel of a display device according to an embodiment. FIG. 12 illustrates cross-sections of a fourth transistor T4 and a leakage prevention diode LD_1.

Referring to FIG. 12, a first electrode 310_1 of a leakage prevention diode LD_1 of a display panel 10_1 is different from the first electrode 310 illustrated in FIG. 7 in that the first electrode 310_1 is part of a first conductive layer 200.

The first electrode 310_1 of the leakage prevention diode LD_1 may be disposed on one surface (or face) of the first gate insulating layer GI1 and may be covered by the second gate insulating layer GI2. The first electrode 310_1 of the leakage prevention diode LD_1 may be located between the first gate insulating layer GI1 and the second gate insulating layer GI2. In the leakage prevention diode LD_1, the second gate insulating layer GI2 and the first interlayer insulating layer ILD1 may be located between the first electrode 310_1 and the second electrode 411. The insulator of the leakage prevention diode LD_1 may include the second gate insulating layer GI2 and the first interlayer insulating layer ILD1.

Even if the active layer of the third transistor T3 is part of the first semiconductor layer 100 (refer to FIG. 6), the leakage prevention diode LD_1 may be further provided, thereby more easily minimizing or preventing the leakage of a current. Moreover, as the insulator of the leakage prevention diode LD_1 includes the second gate insulating layer GI2 and the first interlayer insulating layer ILD1, the thickness of the insulator of the leakage prevention diode LD_1 may be easily adjusted with the characteristics of each of the insulating layers GI2 and ILD1 being maintained. Accordingly, the characteristics of the leakage prevention diode LD_1 may be optimized with the insulating characteristics of each of the insulating layers GI2 and ILD1 being maintained.

Figure 13:
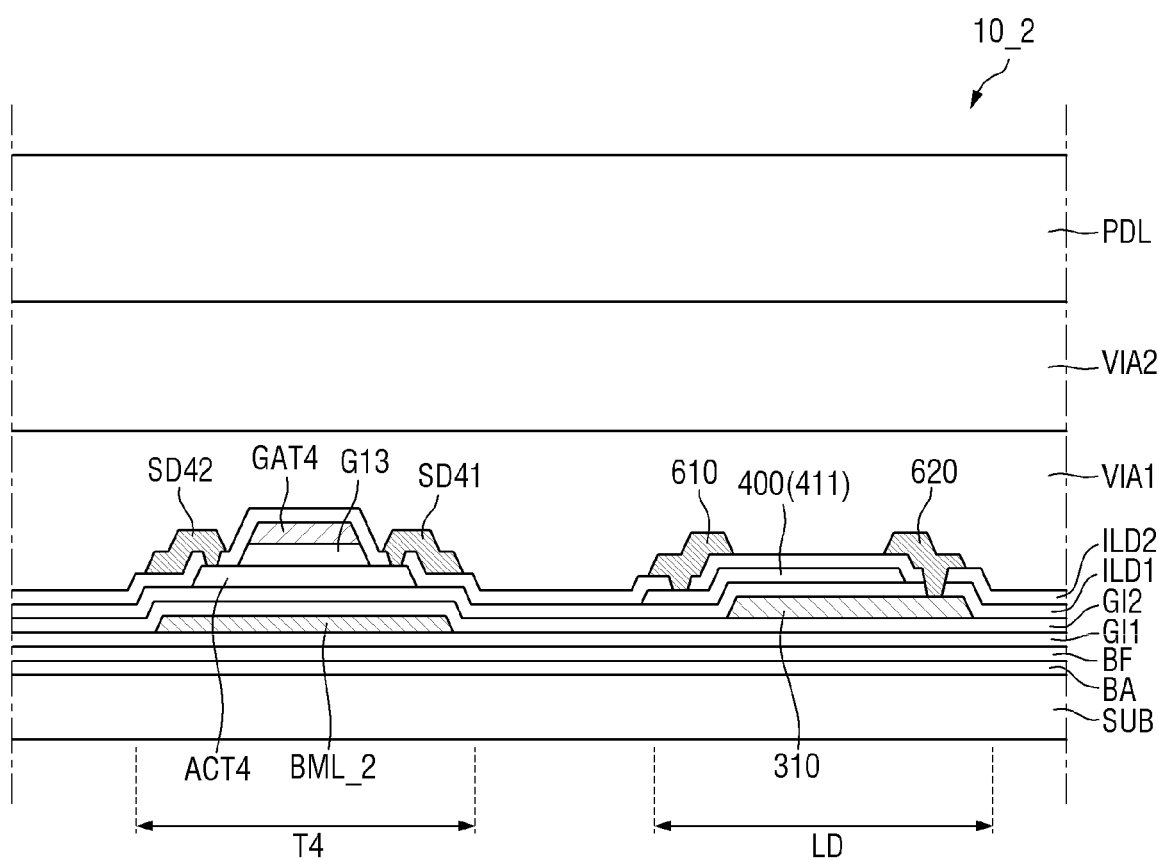
FIG. 13 is a cross-sectional view of a display panel of a display device according to an embodiment.

FIG. 13 is a cross-sectional view of a display panel of a display device according to an embodiment. FIG. 13 illustrates cross-sections of a fourth transistor T4 and a leakage prevention diode LD.

Referring to FIG. 13, a display panel 10_2 is different from the display panel illustrated in the embodiment of FIG. 7 in that a lower light blocking pattern BML_2 is further provided under the fourth transistor T4 of each pixel of the display panel 10_2.

A first conductive layer 200 of the display panel 10_2 may further include a lower light blocking pattern BML_2. The lower light blocking pattern BML_2 may be disposed under the active layer ACT4 of the fourth transistor T4.

The lower light blocking pattern BML_2 may prevent light incident from the lower direction of the display panel 10 from entering the active layer ACT4 of the fourth transistor T4. The lower light blocking pattern BML_2 may overlap at least the channel region of the active layer ACT4 of the fourth transistor T4.

In some embodiments, the lower light blocking pattern BML_2 may be used as another gate electrode of the fourth transistor T4. The lower light blocking pattern BML_2 may be electrically connected to the gate electrode GAT4 of the fourth transistor T4. The lower light blocking pattern BML_2 may be electrically connected to one of the first source/drain electrode SD41 and second source/drain electrode SD42 of the fourth transistor T4.

Even if the active layer of the third transistor T3 is part of the first semiconductor layer 100 (refer to FIG. 6), the leakage prevention diode LD_1 may be further provided, thereby more easily minimizing or preventing the leakage of a current. Given the lower light blocking pattern BML_2 provided under the active layer ACT4, reliability of the fourth transistor T4 may be improved, such that reliability of the display panel 10_2 may be improved.

Figure 14:
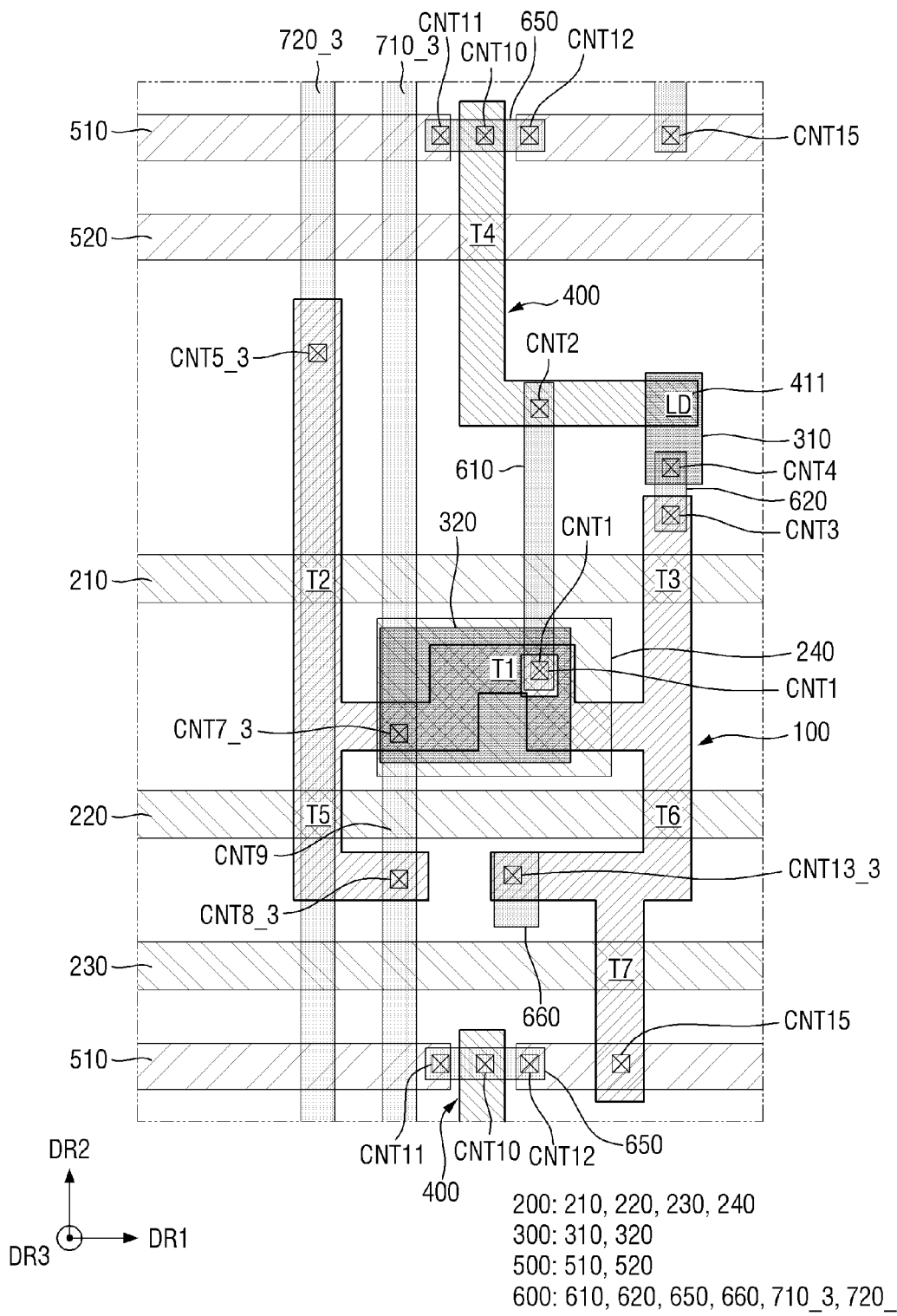
FIG. 14 is a layout view of one pixel of a display device according to an embodiment.
Figure 15:
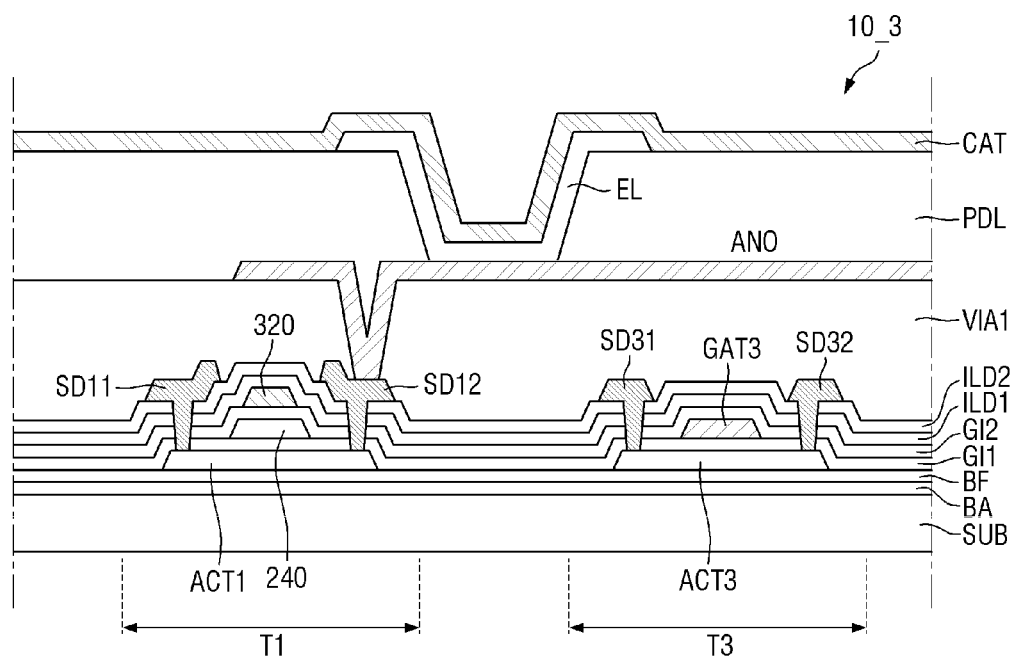
FIG. 15 is a cross-sectional view of a display panel according to an embodiment.

FIG. 14 is a layout view of one pixel of a display device according to an embodiment. FIG. 15 is a cross-sectional view of a display panel according to an embodiment. FIG. 15 illustrates cross-sections of a first transistor T1 and a third transistor T3.

Referring to FIGS. 14 and 15, a display panel 10_3 is different from the display panel illustrated in FIG. 4 in that the display panel 10_3 does not include a fifth conductive layer 700 (illustrated in FIG. 4).

In one pixel of the display panel 10_3, a fourth conductive layer 600 may include a first power voltage line 710_3 and a data line 720_3 as well as the data patterns 610, 620, 650, and 660. The first power voltage line 710_3 and the data line 720_3 may be disposed on the same layer as each of the data patterns 610, 620, 650, and 660. The first power voltage line 710_3 and the data line 720_3 may be separated and may be spaced apart from each of the data patterns 610, 620, 650, and 660.

The third data pattern 630 (refer to FIG. 4) and the fourth data pattern 640 (refer to FIG. 4) may be optional. The first power voltage line 710_3 may be in direct contact with the gate electrode 320 of the first transistor T1 and the second horizontal portion 140 of the first semiconductor layer 100 through contact holes CNT7_3 and CNT8_3. The data line 720_3 may be in direct contact with the upper portion 111 of the first vertical portion 110 of the first semiconductor layer 100 through a contact hole CNT5_3.

The connection electrode 730 (refer to FIG. 4) may be optional. The anode electrode ANO of the organic light emitting diode OLED may be in direct contact with the second electrode SD12 of the first transistor T1 without requiring the connection electrode 730 (refer to FIG. 4).

Even if the active layer of the third transistor T3 is part of the first semiconductor layer 100 (refer to FIG. 6), the leakage prevention diode LD_1 may be further provided, thereby more easily minimizing or preventing the leakage of a current.

Many variations and modifications can be made to the described example embodiments without substantially departing from the scope defined by the claims.

What is claimed is:

1. A display device, comprising:
   a light emitting element;
   a first transistor controlling a driving current flowing to the light emitting element depending on a voltage applied to a gate electrode of the first transistor;

a compensation transistor electrically connected between the gate electrode of the first transistor and a first electrode of the first transistor; and
a diode electrically connected through the second compensation transistor to the first electrode of the first transistor,
wherein a first electrode of the diode is electrically connected to a first electrode of the compensation transistor,
wherein a second electrode of the diode is connected to the gate electrode of the first transistor, and
wherein the first electrode of the diode is electrically connected to an anode of the light emitting element through the compensation transistor and a fifth transistor.

2. The display device of claim 1,
wherein the first electrode of the diode includes a metal, and wherein the second electrode of the diode includes an oxide semiconductor.

3. The display device of claim 2,
wherein, in the diode, a current flows from the first electrode of the diode to the second electrode of the diode.

4. The display device of claim 1,
wherein each of an active layer of the first transistor and an active layer of the second compensation transistor includes polycrystalline silicon.

5. The display device of claim 4, further comprising:
a third transistor electrically connected to the gate electrode of the first transistor and receiving an initialization voltage,
wherein an active layer of the third transistor includes an oxide semiconductor.

6. The display device of claim 5,
wherein the first transistor and the compensation transistor are PMOS transistors, and wherein the third transistor is an NMOS transistor.

7. The display device of claim 5, wherein a material of the second electrode of the diode is identical to a material of the active layer of the third transistor.

8. The display device of claim 7, further comprising:
an insulator; and
a capacitor, wherein a first electrode of the capacitor is electrically connected to the gate electrode of the first transistor, wherein a second electrode of the capacitor overlaps the first electrode, and wherein the first electrode of the diode and the second electrode of the capacitor are disposed directly on a same surface of the insulator.

9. The display device of claim 1, further comprising:
a fourth transistor electrically connected to a second electrode of the first transistor and receiving a data voltage; and
a scan line electrically connected through no intervening transistor to both a gate electrode of the compensation transistor and a gate electrode of the fourth transistor.

10. A display device, comprising:
a light emitting element;
a first transistor controlling a driving current flowing to the light emitting element depending on a voltage applied to a gate electrode of the first transistor;
a compensation transistor electrically connected between the gate electrode of the first transistor and a first electrode of the first transistor;
a third transistor electrically connected through no intervening transistor to the gate electrode of the first transistor and receiving an initialization voltage,
wherein each of an active layer of the first transistor and an active layer of the compensation transistor includes polycrystalline silicon, and wherein an active layer of the third transistor includes an oxide semiconductor; and
a diode electrically connected between the second electrode of the compensation transistor and the gate electrode of the first transistor,
wherein a first electrode of the diode includes a metal,
wherein a second electrode of the diode includes an oxide semiconductor, and
wherein a material of the second electrode of the diode is identical to a material of the active layer of the third transistor.

11. The display device of claim 10, further comprising:
an insulator; and
a capacitor, wherein a first electrode of the capacitor is electrically connected to the gate electrode of the first transistor, wherein a second electrode of the capacitor overlaps the first electrode, and wherein the first electrode of the diode and the second electrode of the capacitor are disposed directly on a same surface of the insulator.

12. The display device of claim 10, further comprising:
a fourth transistor electrically connected to a second electrode of the first transistor and receiving a data voltage; and
a scan line electrically connected through no intervening transistor to both a gate electrode of the compensation transistor and a gate electrode of the fourth transistor.

13. A display device, comprising:
a substrate;
a first transistor;
a first gate insulating layer disposed between a gate electrode of the first transistor and an active layer of the first transistor, wherein the active layer of the first transistor is disposed between the gate electrode of the first transistor and the substrate;
a diode;
a second gate insulating layer disposed between a first electrode of the diode and the substrate, wherein the gate electrode of the first transistor is disposed between the second gate insulating layer and the substrate;
a first interlayer insulating layer disposed between a second electrode of the diode and the substrate, wherein the first electrode of the diode is disposed between the first interlayer insulating layer and the substrate;
a compensation transistor, wherein the first interlayer insulating layer is disposed between an active layer of a compensation transistor and the substrate;
a second interlayer insulating layer disposed between a first electrode of the first transistor and the substrate and disposed between a second electrode of the first transistor and the substrate, wherein each of the second electrode of the diode and the active layer of the compensation transistor is disposed between the second interlayer insulating layer and the substrate,
wherein the active layer of the first transistor includes polycrystalline silicon, and wherein each of the active layer of the compensation transistor and the second electrode of the diode includes an oxide semiconductor.

14. The display device of claim 13, further comprising:
a connection member electrically connecting the first electrode of the first transistor and the first electrode of the diode.

15. The display device of claim 14,
wherein the connection member is connected to a first electrode of the compensation transistor through a first contact hole penetrating the second interlayer insulating layer, the first interlayer insulating layer, the second gate insulating layer, and the first gate insulating layer.

16. The display device of claim 14,
wherein the connection member is connected to the first electrode of the diode through a second contact hole penetrating the second interlayer insulating layer and the first interlayer insulating layer.

17. The display device of claim 13, further comprising:
a capacitor,
wherein a first electrode of the capacitor is electrically connected to the gate electrode of the first transistor,
wherein a second electrode of the capacitor overlaps the first electrode of the capacitor, and
wherein the second gate insulating layer is disposed between the second electrode of the capacitor and the substrate.

18. The display device of claim 17,
wherein a material of the first electrode of the diode is identical to a material of the second electrode of the capacitor.

* * * * *